United States Patent
Kang

(10) Patent No.: US 10,734,396 B2
(45) Date of Patent: Aug. 4, 2020

(54) THREE-DIMENSIONAL SEMICONDUCTOR MEMORY DEVICES HAVING DUMMY CHANNEL LAYERS

(71) Applicant: SK hynix Inc., Icheon-si, Gyeonggi-do (KR)

(72) Inventor: Byung Woo Kang, Hwaseong-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/788,476

(22) Filed: Oct. 19, 2017

(65) Prior Publication Data

US 2018/0277556 A1  Sep. 27, 2018

(30) Foreign Application Priority Data

Mar. 21, 2017 (KR) .................. 10-2017-0035483

(51) Int. Cl.
| | | |
|---|---|---|
| *H01L 29/76* | (2006.01) | |
| *H01L 27/11556* | (2017.01) | |
| *H01L 27/11519* | (2017.01) | |
| *H01L 27/11582* | (2017.01) | |
| *H01L 21/762* | (2006.01) | |
| *H01L 27/11565* | (2017.01) | |

(52) U.S. Cl.
CPC .. *H01L 27/11556* (2013.01); *H01L 21/76224* (2013.01); *H01L 27/11519* (2013.01); *H01L 27/11565* (2013.01); *H01L 27/11582* (2013.01)

(58) Field of Classification Search
CPC ......... H01L 27/11556; H01L 27/11565; H01L 21/76224; H01L 27/11519; H01L 27/11582
See application file for complete search history.

(56) References Cited

U.S. PATENT DOCUMENTS

| | | | |
|---|---|---|---|
| 9,076,820 B2* | 7/2015 | Kitazaki | H01L 29/66666 |
| 9,153,705 B2 | 10/2015 | Zhang et al. | |
| 2012/0208347 A1* | 8/2012 | Hwang | H01L 27/1157 438/430 |
| 2013/0140623 A1* | 6/2013 | Lee | H01L 27/11578 257/324 |
| 2013/0256777 A1* | 10/2013 | Khoueir | H01L 27/11556 257/316 |
| 2014/0239376 A1* | 8/2014 | Zhang | H01L 27/1052 257/324 |
| 2015/0011062 A1* | 1/2015 | Khoueir | H01L 29/42324 438/257 |
| 2015/0340377 A1* | 11/2015 | Lee | H01L 29/66833 257/314 |
| 2017/0194326 A1* | 7/2017 | Kim | H01L 23/5283 |
| 2017/0213845 A1* | 7/2017 | Baba | H01L 29/40117 |
| 2017/0373089 A1* | 12/2017 | Kim | H01L 27/11582 |
| 2018/0247949 A1* | 8/2018 | Choi | H01L 27/11519 |

FOREIGN PATENT DOCUMENTS

| | | |
|---|---|---|
| KR | 1020140112827 A | 9/2014 |
| KR | 1020150116995 A | 10/2015 |
| KR | 1020160137750 A | 12/2016 |

\* cited by examiner

*Primary Examiner* — Ismail A Muse
(74) *Attorney, Agent, or Firm* — William Park & Associates Ltd.

(57) ABSTRACT

Provided herein may be a semiconductor device. The semiconductor device may include a stack, channel holes passing through the stack, dummy channel holes passing through the stack and disposed between the channel holes, a slit passing through the stack and the dummy channel holes.

19 Claims, 19 Drawing Sheets

THREE-DIMENSIONAL SEMICONDUCTOR MEMORY DEVICES HAVING DUMMY CHANNEL LAYERS

CROSS-REFERENCE TO RELATED APPLICATION

The present application claims priority under 35 U.S.C. § 119(a) to Korean patent application number 10-2017-0035483 filed on Mar. 21, 2017 in the Korean Intellectual Property Office, the entire disclosure of which is incorporated herein by reference.

BACKGROUND

1. Technical Field

Various embodiments of the present disclosure may generally relate to an electronic device, and more particularly, to a semiconductor device and a method of manufacturing the same.

2. Related Art

Non-volatile memory devices retain stored data regardless of the power on/off conditions of the non-volatile memory device. Recently, as improvements for the integration of a two-dimensional non-volatile memory device including memory cells formed on a substrate in a single layer reaches its limits, a three-dimensional (3D) non-volatile memory device including memory cells stacked in a vertical direction on a substrate has been proposed.

A three-dimensional non-volatile memory device may include interlayer insulating layers and gate electrodes that are stacked alternately with each other, and channel layers passing therethrough, with memory cells stacked along the channel layers. To improve the operational reliability of such a non-volatile memory device having a three-dimensional structure, various structures and manufacturing methods have been developed.

SUMMARY

An embodiment of the present disclosure may provide for a semiconductor device. The semiconductor device may include a stack. The semiconductor device may include channel holes passing through the stack. The semiconductor device may include dummy channel holes passing through the stack and disposed between the channel holes. The semiconductor device may include a slit passing through the stack and overlapping with the dummy channel holes to integrally couple the dummy channel holes with the slit. The semiconductor device may include channel layers formed in the channel holes. The semiconductor device may include dummy channel layers including first semiconductor patterns formed in the dummy channel holes, and second semiconductor patterns formed in the slit and coupling the first semiconductor patterns with each other.

An embodiment of the present disclosure may provide for a semiconductor device. The semiconductor device may include a stack. The semiconductor device may include a channel layer passing through the stack to a first depth. The semiconductor device may include a dummy channel layer including first semiconductor patterns passing through the stack to the first depth, and second semiconductor patterns passing through the stack to a second depth less than the first depth and coupling the first semiconductor patterns with each other.

An embodiment of the present disclosure may provide for a method of manufacturing a semiconductor device. The method of manufacturing the semiconductor device may include forming a stack. The method of manufacturing the semiconductor device may include forming channel holes and dummy channel holes in the stack. The method of manufacturing the semiconductor device may include forming sacrificial layers in the channel holes and the dummy channel holes. The method of manufacturing the semiconductor device may include forming a slit passing through the stack and the dummy channel holes to a predetermined depth. The method of manufacturing the semiconductor device may include removing the sacrificial layers. The method of manufacturing the semiconductor device may include forming channel layers in the channel holes and a dummy channel layer in the dummy channel holes and the slit.

An embodiment of the present disclosure may provide for a method of manufacturing a semiconductor device. The method of manufacturing the semiconductor device may include forming a stack. The method of manufacturing the semiconductor device may include forming a channel layer in the stack to a first depth. The method of manufacturing the semiconductor device may include forming a dummy channel layer including first semiconductor patterns passing through the stack to the first depth, and second semiconductor patterns passing through the stack to a second depth less than the first depth and coupling the first semiconductor patterns with each other.

An embodiment of the present disclosure may provide for a semiconductor device. The semiconductor device may include a stack. The semiconductor device may include channel structures passing through the stack. The semiconductor device may include a slit insulating layer passing through the stack and including first regions and a second regions alternately arranged. The second regions may couple the corresponding adjacent first regions.

BRIEF DESCRIPTION OF THE DRAWINGS

FIGS. 3A to 7A, 3B to 7B and 3C to 7C are plan diagrams and sectional diagrams illustrating a method of manufacturing a semiconductor device according to an embodiment of the present disclosure.

DETAILED DESCRIPTION

Figure 1A:
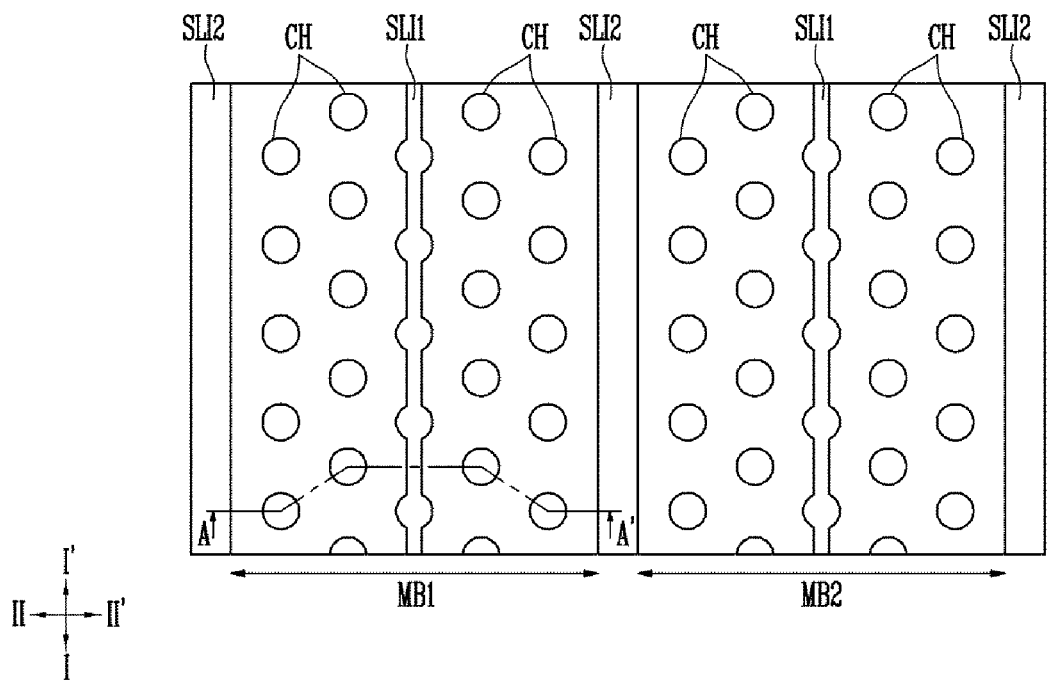
FIGS. 1A and 1B are a plan diagram and a sectional diagram illustrating the structure of a semiconductor device according to an embodiment of the present disclosure.

Examples of embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Various embodiments of the present disclosure may be directed to a semiconductor device which is configured to facilitate the manufacturing process thereof and may have a stable structure and improved characteristics, and a method of manufacturing the same.

Figure 1B:
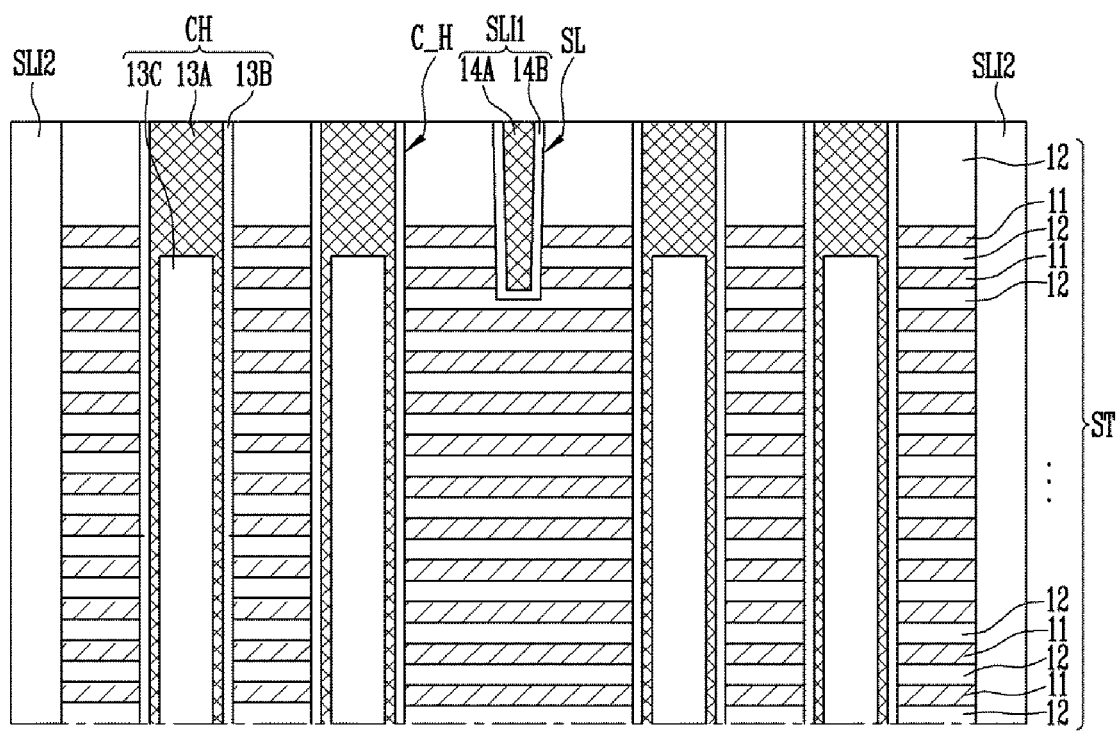

FIGS. 1A and 1B are diagrams illustrating the structure of a semiconductor device according to an embodiment of the present disclosure. FIG. 1A is a layout diagram, and FIG. 1B is a sectional view taken along line A-A' of FIG. 1A.

Referring to FIGS. 1A and 1B, the semiconductor device according to an embodiment of the present disclosure includes a plurality of memory blocks MB1 and MB2. Memory strings are arranged in each of the memory blocks MB1 and MB2. Each memory block MB1, MB2 may be the unit in which data is erased during an erase operation.

The semiconductor device may include a stack ST including stacked memory cells, a channel structure CH passing through the stack ST, and slit insulating layers SLI1 and SLI2. The stack ST may include conductive layers 11 and insulating layers 12 which are alternately stacked. Each conductive layer 11 may be a gate electrode of a memory cell, a select transistor, or the like, and include metal such as tungsten. The insulating layers 12 may insulate the stacked conductive layers 11 from each other.

For example, at least one uppermost conductive layer 11 may be a gate electrode of a drain select transistor, at least one lowermost conductive layer 11 may be a gate electrode of a source select transistor, and the other conductive layers 11 may be gate electrodes of the memory cells. In this case, at least one source select transistor, a plurality of memory cells, and at least one drain select transistor may be coupled in series to each other to configure a vertical memory string. In addition, a lower structure such as a source line or a peripheral circuit may be disposed below the stack ST.

In an embodiment, at least one uppermost conductive layer 11 may be a gate of the source or drain select transistor, at least one lowermost conductive layer 11 may be a pipe gate, and the other conductive layers 11 may be gate electrodes of the memory cells. In addition, a lower structure such as a peripheral circuit may be disposed below the stack ST. In this case, at least one source select transistor, a plurality of memory cells, at least one pipe transistor, a plurality of memory cells, and at least one drain select transistor may be coupled in series to each other to configure a U-shaped memory string.

The plurality of channel structures CH may be arranged in a first direction I-I' and in a second direction II-II' intersecting the first direction I-I'. The channel structures CH adjacent to each other in the second direction II-II' may be alternately arranged such that the centers thereof are offset from each other.

The channel structures CH may be disposed in channel holes C_H passing through the stack ST. Each of the channel structures CH includes a channel layer 13A and a memory layer 13B enclosing the channel layer 13A. The channel layer 13A may have a solid structure, or a tubular structure in which a central region thereof is open. When the channel layer 13A has an open central region, the channel structure CH may further include a gap fill insulating layer 13C formed in the channel layer 13A. The memory layer 13B may include at least one of a tunnel insulating layer, a data storing layer, and a charge blocking layer. The data storing layer may include a floating gate, a charge trap layer, nanodots, a phase-change material layer, etc.

The slit insulating layers SLI1 and SLI2 function to insulate the conductive layers 11 disposed on the same level from each other, and each includes an insulating material such as an oxide layer. The slit insulating layer SLI1, SLI2 may be disposed between adjacent channel structures CH in the memory block MB1, MB2, or be disposed on a boundary between the adjacent memory blocks MB1 and MB2. Furthermore, each slit insulating layer SLI1, SLI2 may have a depth at which it completely or partially passes though the stack ST.

The first slit insulating layer SLI1 may be disposed in the memory block MB1, MB2, and have a depth at which it partially passes through the stack ST. For example, the first slit insulating layer SLI1 may have a depth at which it passes through conductive layers 11 corresponding to select lines among the conductive layers 11. The first slit insulating layer SLI1 may have a depth at which it separates the select lines disposed on the same level from each other. In this case, the bottom of the first slit insulating layer SLI1 may be disposed on a level equal to or higher than an upper surface of an uppermost word line among the conductive layers 11.

The first slit insulating layer SLI1 may include a semiconductor pattern 14A, and an insulating pattern 14B enclosing the semiconductor pattern 14A. The semiconductor pattern 14A may include material which can be used as a channel layer of a memory cell, a select transistor, etc., and may include silicon (Si), germanium (Ge), etc. For example, the semiconductor pattern 14A may be a dummy channel layer that is made of the same material as that of the channel layer 13A. The insulating pattern 14B may include material which can used as a memory layer of a memory cell, and may include at least one of a charge blocking layer, a data storing layer, and a tunnel insulating layer. For example, the insulating pattern 14B may be a dummy memory layer which is made of the same material as that of the memory layer 13B. Furthermore, since the insulating pattern 14B has a structure for enclosing the sidewall and the bottom of the semiconductor pattern 14A, the semiconductor pattern 14A may be insulated from the conductive layers 11 and be in a floating state.

The first slit insulating layer SLI1 extends in the first direction I-I' so that the conductive layers 11 disposed on opposite sides thereof are insulated from each other. In addition, the first slit insulating layer SLI1 may have different widths depending on a region, and have a form in which a plurality of island patterns arranged in the first direction I-I' and line patterns coupling the plurality of island patterns with each other are alternately arranged.

The second slit insulating layer SLI2 may be disposed between the adjacent memory blocks MB1 and MB2 and pass through the stack ST to a depth greater than that of the first slit insulating layer SLI1. The second slit insulating layer SLI2 may have a depth at which it completely passes through the stack ST to insulate the adjacent memory blocks MB1 and MB2 from each other. The second slit insulating layer SLI2 may extend in the first direction I-I'. Furthermore, the second slit insulating layer SLI2 may have a line shape with a constant width. For reference, the second slit insulating layer SLI2 may have a shape similar to that of the first slit insulating layer SLI1.

Figure 2A:
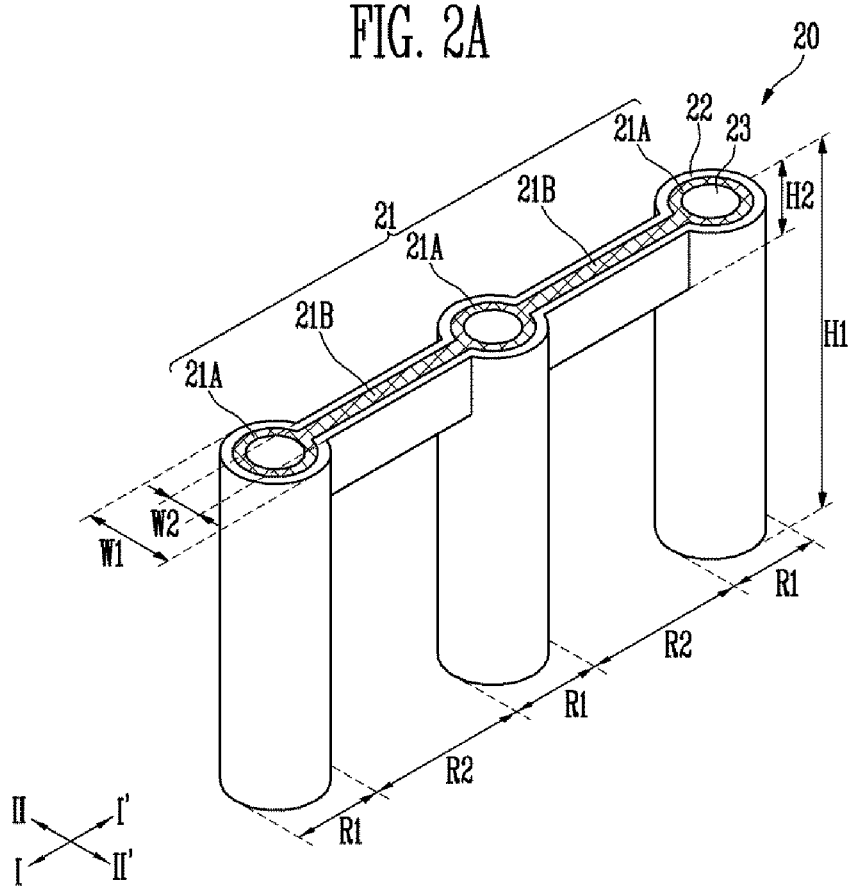
FIGS. 2A to 2C are perspective views illustrating the structure of a semiconductor device in accordance with an embodiment of the present disclosure.
Figure 2B:
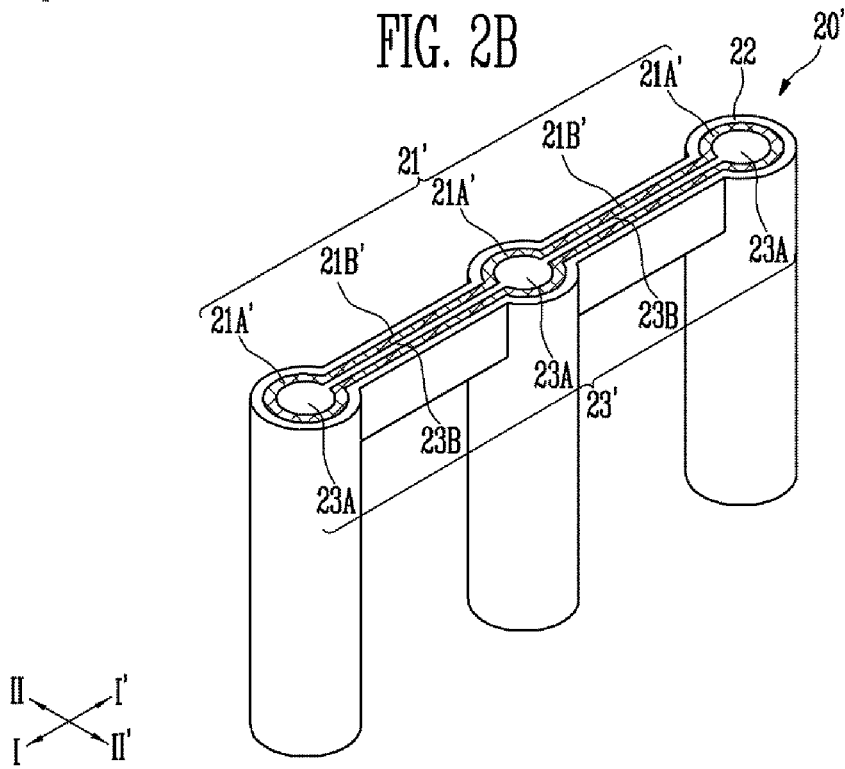
Figure 2C:
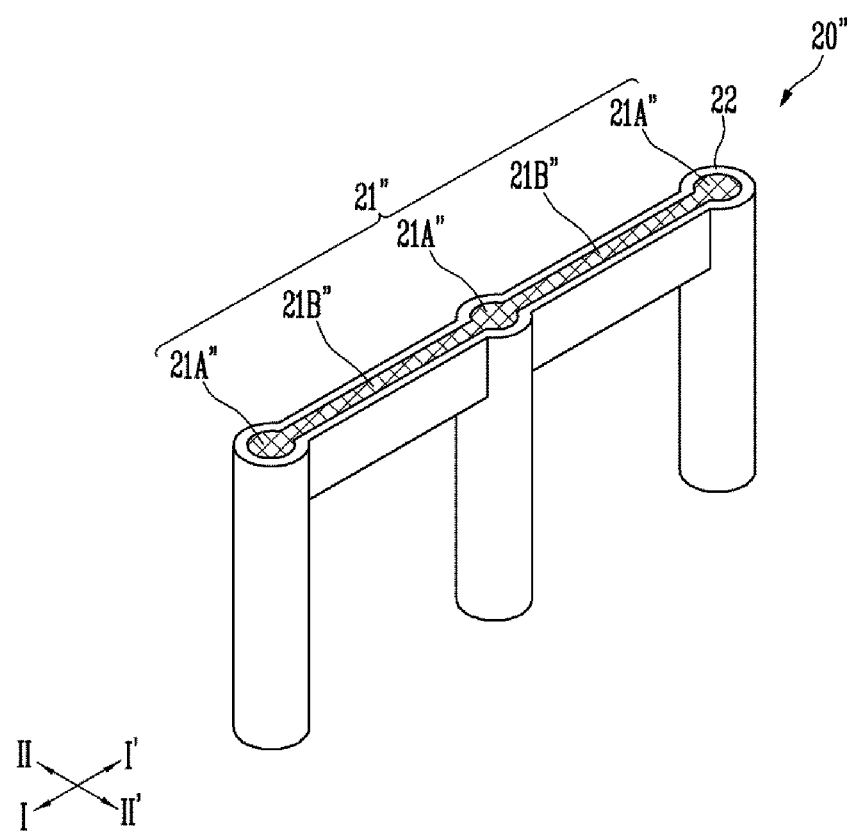

FIGS. 2A to 2C are views illustrating the structure of a semiconductor device in accordance with an embodiment of the present disclosure and are perspective views illustrating the structure of a slit insulating layer.

Referring to FIG. 2A, a slit insulating layer 20 includes a semiconductor pattern 21 extending in the first direction I-I', a dummy memory layer 22 enclosing the semiconductor pattern 21, and a dummy gap fill insulating layer 23 provided in the semiconductor pattern 21. The semiconductor pattern 21 may be a dummy channel layer.

The slit insulating layer 20 may have a structure in which first regions R1 and second regions R2 are alternately arranged. The first regions R1 and the second regions R2 may have different cross-sectional shapes. For example, each first region R1 of the slit insulating layer 20 may have a pillar shape with a cross-section shape, such as, but not limited to, a circle, an ellipse, a rectangle, a polygon, etc. Each second region R2 of the slit insulating layer 20 may have a line shape in which the second region R2 couples the corresponding adjacent first regions R1 with each other in the first direction I-I'.

The first regions R1 and the second regions R2 may have different widths. For example, each first region R1 of the slit insulating layer 20 may have a first width W1, and each second region R2 of the slit insulting layer 20 may have a second width W2 less than the first width W1. The first regions R1 and the second regions R2 may have different heights. Each first region R1 may have a first height H1, and each second region R2 may have a second height H2 less than the first height.

The semiconductor pattern 21 includes first semiconductor patterns 21A corresponding to the first regions R1 of the slit insulating layer 20, and second semiconductor patterns 21B corresponding to the second regions R2 of the slit insulating layer 20. The first semiconductor patterns 21A and the second semiconductor patterns 21B are alternately arranged. The first semiconductor patterns 21A are coupled with each other by the second semiconductor patterns 21B. The first and second semiconductor patterns 21A and 21B may include semiconductor material.

The semiconductor pattern 21 may vary in cross-sectional shape or width depending on regions. For instance, each first semiconductor pattern 21A may have a pillar shape with a cross-section shape, such as, but not limited to, a circle, an ellipse, a rectangle, a polygon, etc., and each second semiconductor pattern 21B may have a line shape with a constant width. In addition, each first semiconductor pattern 21A may have a width greater than that of each second semiconductor pattern 21B.

The semiconductor pattern 21 may vary in height depending on regions. For example, each first semiconductor pattern 21A may have a height greater than that of each second semiconductor pattern 21B. In addition, upper surfaces of the first semiconductor patterns 21A and upper surfaces of the second semiconductor patterns 21B may be disposed on the same level. Each first semiconductor pattern 21A may pass through the stack to a first depth, and each second semiconductor pattern 21B may pass through the stack to a second depth less than the first depth.

The semiconductor pattern 21 may vary in structure depending on regions. For instance, each first semiconductor pattern 21A may have a structure in which a central region thereof is open. Each second semiconductor pattern 21B may have a solid structure.

The dummy memory layer 22 has a structure such that the semiconductor pattern 21 is enclosed by the dummy memory layer 22. For example, the dummy memory layer 22 is formed to enclose the sidewall and the bottom of the semiconductor pattern 21. The dummy memory layer 22 may include multilayer dielectric layers. For instance, the dummy memory layer 22 may include at least one of a tunnel insulating layer, a data storing layer, and a charge blocking layer. The data storing layer may include a floating gate, a charge trap layer, nanodots, a phase-change material layer, etc.

The dummy gap fill insulating layer 23 may be disposed in the semiconductor pattern 21. For example, each dummy gap fill insulating layer 23 may have the form of a pillar with which the open central region of the corresponding first semiconductor pattern 21A is filled. A plurality of dummy gap fill insulating layers 23 may be included in each semiconductor pattern 21. The plurality of dummy gap fill insulating layers 23 may be separated from each other.

The dummy gap fill insulating layer 23 may be an insulating layer such as an oxide layer, and include polysilazane (PSZ), etc. Furthermore, the dummy gap fill insulating layer 23 may include at least one air gap which is disposed therein.

Referring to FIG. 2B, a slit insulating layer 20' has a shape similar to that of the slit insulting layer 20 descried above with reference to FIG. 2A. In an embodiment, for example, the first and second semiconductor patterns 21A' and 21B' may include semiconductor material. However, the shapes of a semiconductor pattern 21' and a dummy gap fill insulating layer 23' may be different from those of FIG. 2A.

In the semiconductor pattern 21, both first semiconductor patterns 21A' and second semiconductor patterns 21B' may have a structure in which a central region thereof is open. In this case, the dummy gap fill insulating layer 23' may be formed to fill the open central regions of the second semiconductor patterns 21B' as well as the open central regions of the first semiconductor patterns 21A'. Therefore, the dummy gap fill insulating layer 23' may include first dummy gap fill insulating patterns 23A, which are formed in the respective first semiconductor patterns 21A, and each of which has a pillar shape, and second dummy gap fill insulating patterns 23B, which are formed in the respective second semiconductor patterns 21B', and each of which has a line shape. The first dummy gap fill insulating patterns 23A and the second dummy gap fill insulating patterns 23B may be alternately arranged. The second dummy gap fill insulating patterns 23B may couple the first dummy gap fill insulating patterns 23A with each other.

Referring to FIG. 2C, a slit insulating layer 20" has a shape similar to that of the slit insulting layer 20 descried above with reference to FIG. 2A. However, the shape of a semiconductor pattern 21" may be different from that of FIG. 2A. In the semiconductor pattern 21", both first semiconductor patterns 21A" and second semiconductor patterns 21B" may have a solid structure. In this case, the slit insulating layer 20" may not include a dummy gap fill insulating layer. In an embodiment, for example, the first and second semiconductor patterns 21A" and 21B" may include semiconductor material.

FIGS. 3A to 7A, 3B to 7B and 3C to 7C are views illustrating a method of manufacturing a semiconductor device according to an embodiment of the present disclosure. FIGS. 3A to 7A are plan views. FIGS. 3B to 7B are sectional views taken along line B-B' of FIGS. 3A to 7A. FIGS. 3C to 7C are sectional views taken along line C-C' of FIGS. 3A to 7A.

Figure 3A:
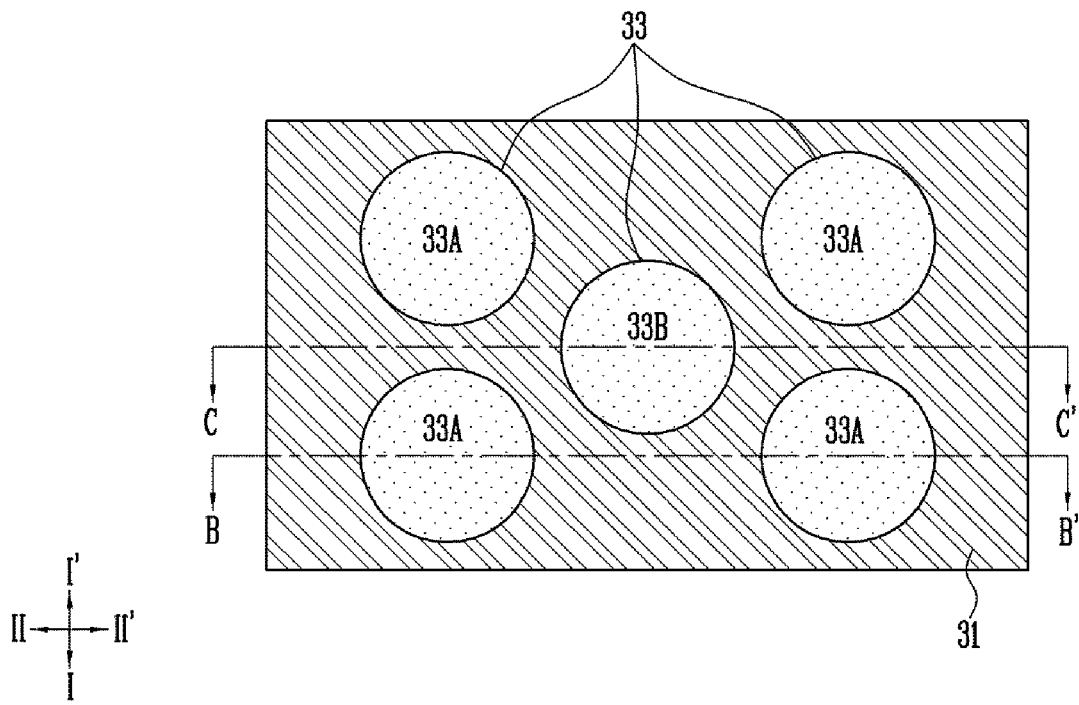
Figure 3B:
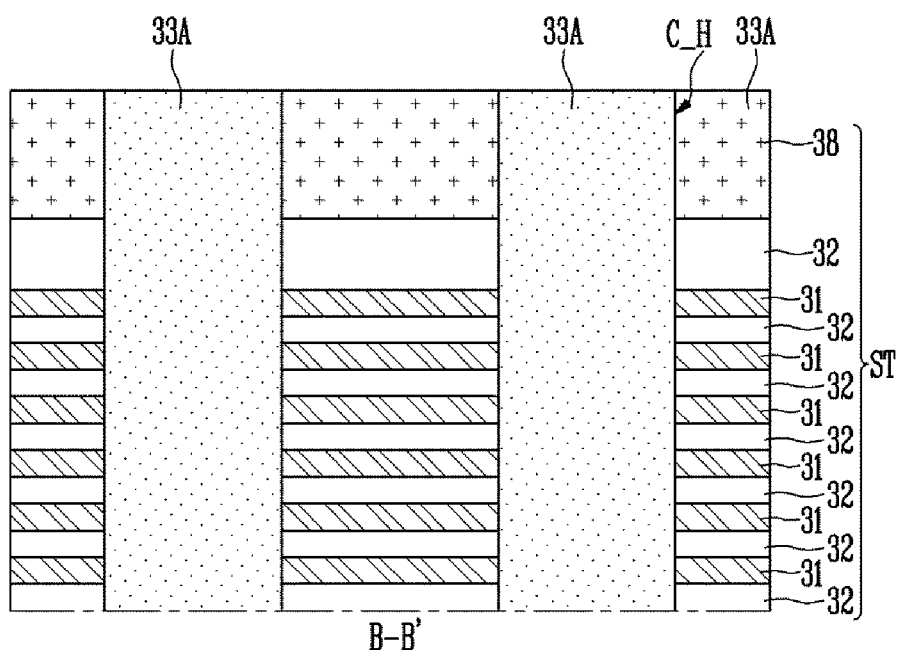
Figure 3C:
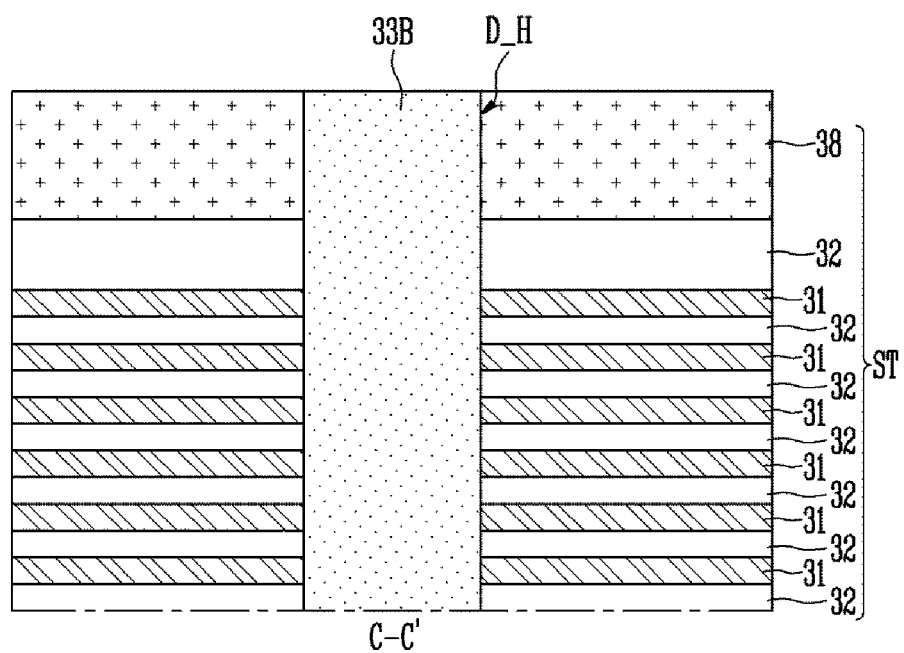

Referring to FIGS. 3A to 3C, a stack ST is formed by alternately stacking first material layers 31 and second material layers 32. The stack ST may be provided to form memory strings including memory cells which are vertically stacked, and may have a high aspect ratio. For reference, an uppermost layer of the stack ST may be a hard mask layer 38. The hard mask layer 38 may be formed of the same material as that of the first material layers 31, and have a thickness greater than that of the first material layers 31.

The first material layers 31 may be provided to form gate electrodes of memory cells, select transistors, and the like. The second material layers 32 may be provided to insulate the stacked gate electrodes from each other.

Here, the first material layers 31 are made of material having a high etch selectivity with respect to the second material layers 32. For example, the first material layers 31 may be sacrificial layers including nitride or the like, and the second material layers 32 may be insulating layers including oxide or the like. Alternatively, the first material layers 31 may be conductive layers including polysilicon, tungsten, or the like, and the second material layers 32 may be insulating layers including oxide or the like. As a further alternative, the first material layers 31 may be conductive layers including doped polysilicon or the like, and the second material layers 32 may be sacrificial layers including undoped polysilicon or the like.

Thereafter, holes C_H and D_H passing through the stack ST are formed. For example, channel holes C_H passing through the stack ST and arranged in the first direction I-I' and the second direction II-II' intersecting the first direction I-I', and dummy channel holes D_H disposed between the channel holes C_H are formed. Each of the dummy channel holes D_H may be disposed between the corresponding four channel holes C_H disposed adjacent to each other in the first direction I-I' and the second direction II-II'. For example, the dummy channel holes D_H may be arranged to be misaligned with the channel holes C_H such that central regions of the channel holes C_H and the dummy channel holes D_H are offset from each other.

The channel holes C_H and the dummy channel holes D_H may be simultaneously formed, and have the same shape and depth. Each of the channel holes C_H and the dummy channel holes D_H may have various cross-sections such as a circle, an ellipse, a rectangle, a polygon, etc.

Thereafter, sacrificial layers 33 are formed in the channel holes C_H and the dummy channel holes D_H. For example, a sacrificial material layer is formed on the stack ST to fill the channel holes C_H and the dummy channel holes D_H, and the sacrificial material layer is thereafter planarized until the surface of the stack ST is exposed. As a result, first sacrificial layers 33A are disposed in the respective channel holes C_H, and second sacrificial layers 33B are disposed in the respective dummy channel holes D_H.

The sacrificial layers 33 are made of material having a high etch selectivity with respect to the first and second material layers 31 and 32. For instance, the sacrificial layers 33 may be a spin on coating (SOC) layer.

Figure 4A:
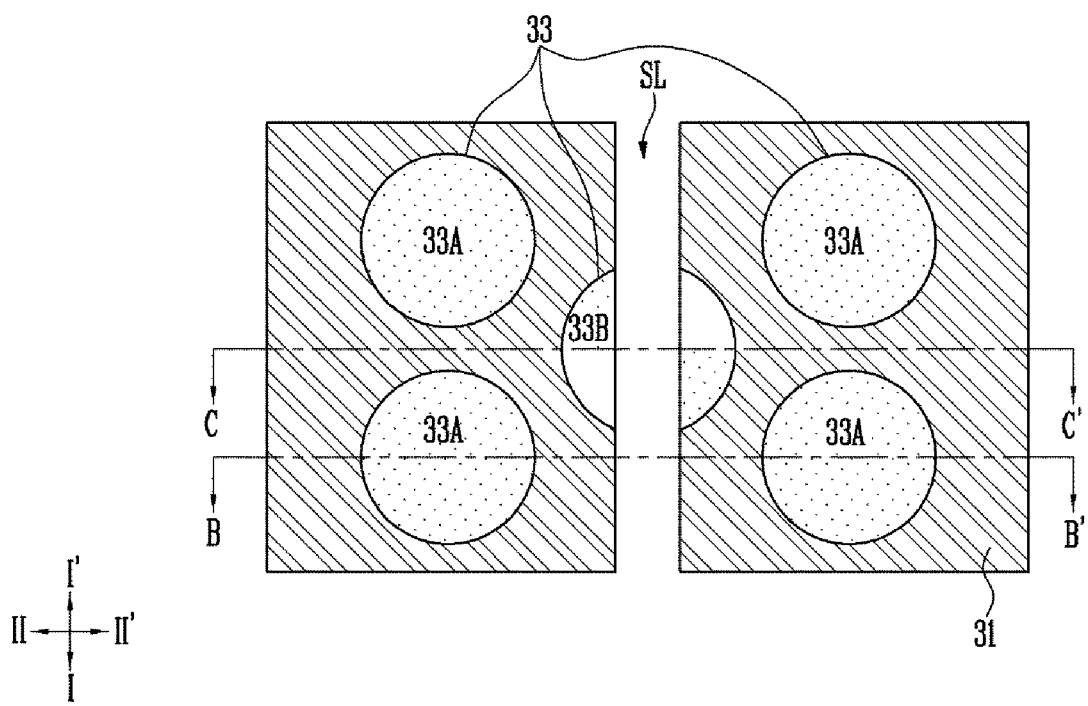
Figure 4B:
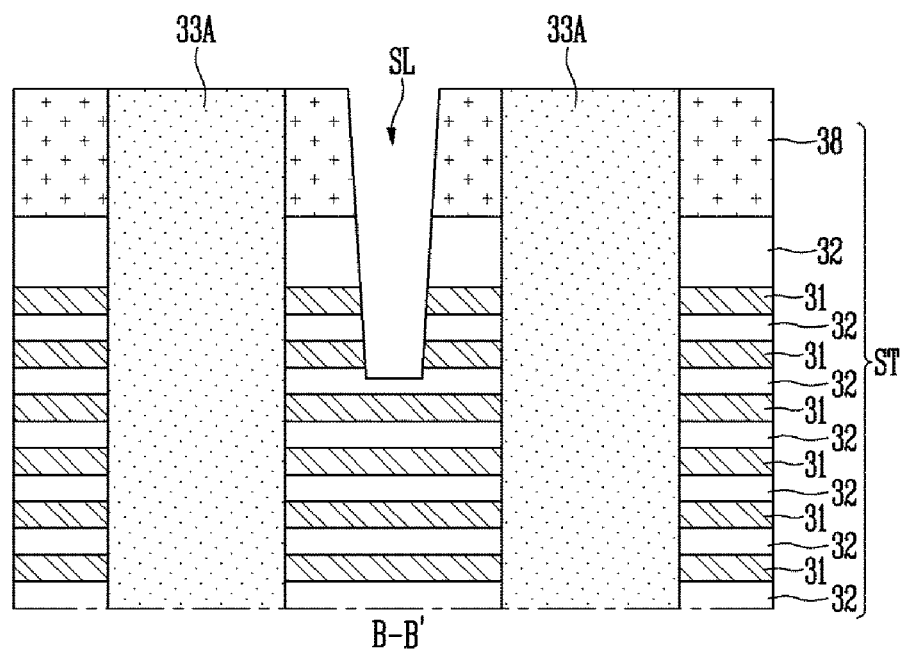
Figure 4C:
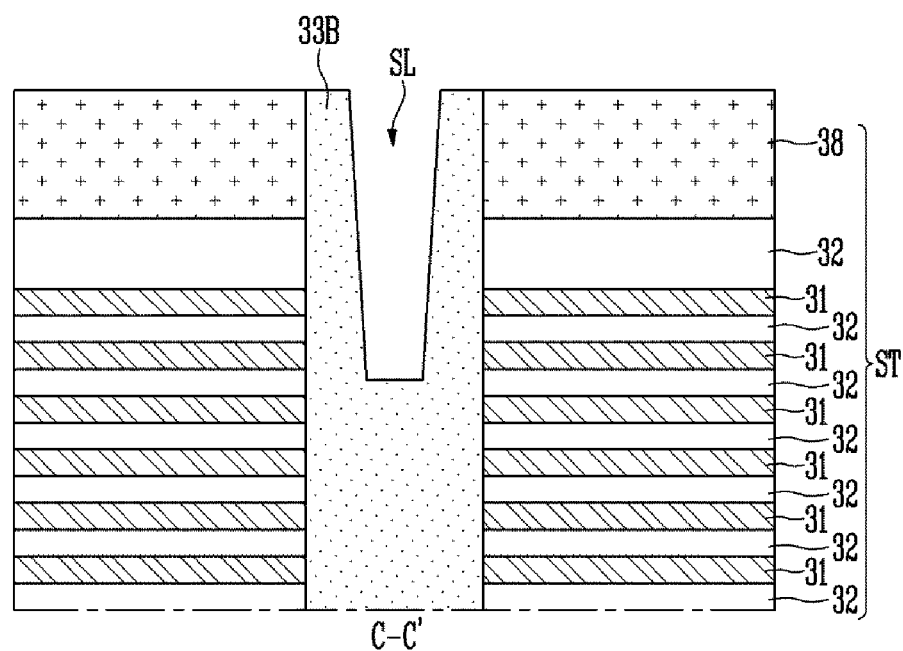

Referring to FIGS. 4A to 4C, a slit SL is formed to pass through the stack ST. The slit SL may pass through the stack ST to a predetermined depth and overlap the dummy channel holes D_H arranged in the first direction I-I'. Therefore, the slit SL may pass through the stack ST and the second sacrificial layers 33B to a predetermined depth.

The slit SL may be formed to a predetermined depth at which it passes through a first material layer to be used for a select line among the first material layers 31. For instance, in the case where one memory string includes two drain select transistors, the slit SL is formed to pass through two first material layers 31 from the uppermost portion of the stack. In this case, the bottom of the slit SL may be disposed at a level equal to or higher than that of an upper surface of first material layer to be used for an uppermost word line among the first material layers 31.

The slit SL may have a width less than that of each dummy channel hole D_H. For example, in the case where each dummy channel hole D_H has a circular cross-section, the slit SL may have a width less than the diameter of the dummy channel hole D_H. The slit SL may be disposed such that the center thereof is aligned with that of the dummy channel holes D_H or such that the center thereof is misaligned with that of the dummy channel holes D_H.

Figure 5A:
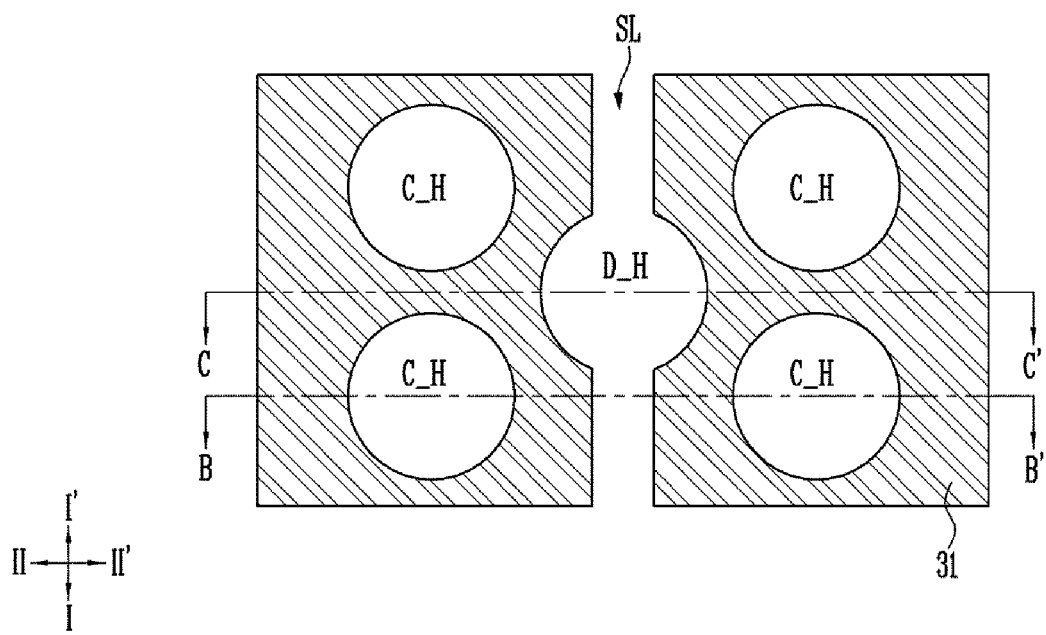
Figure 5B:
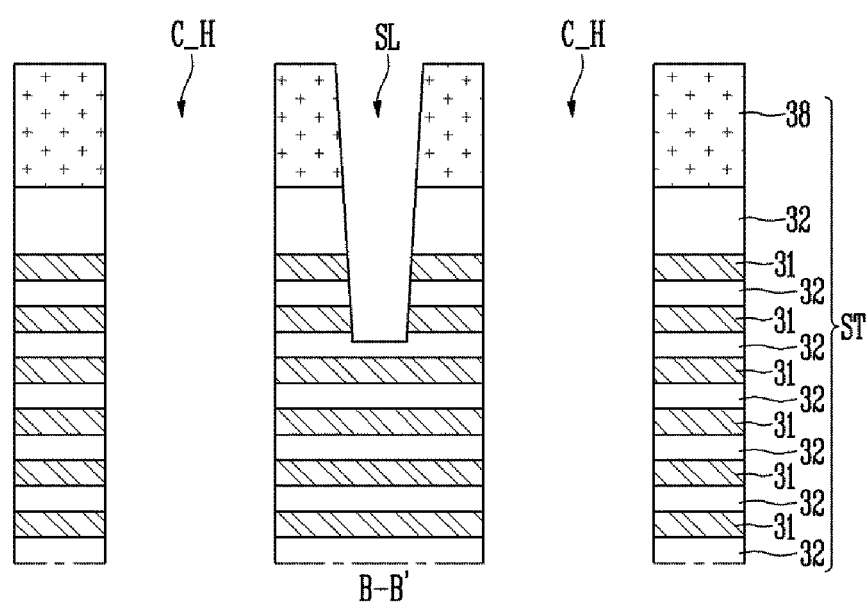
Figure 5C:
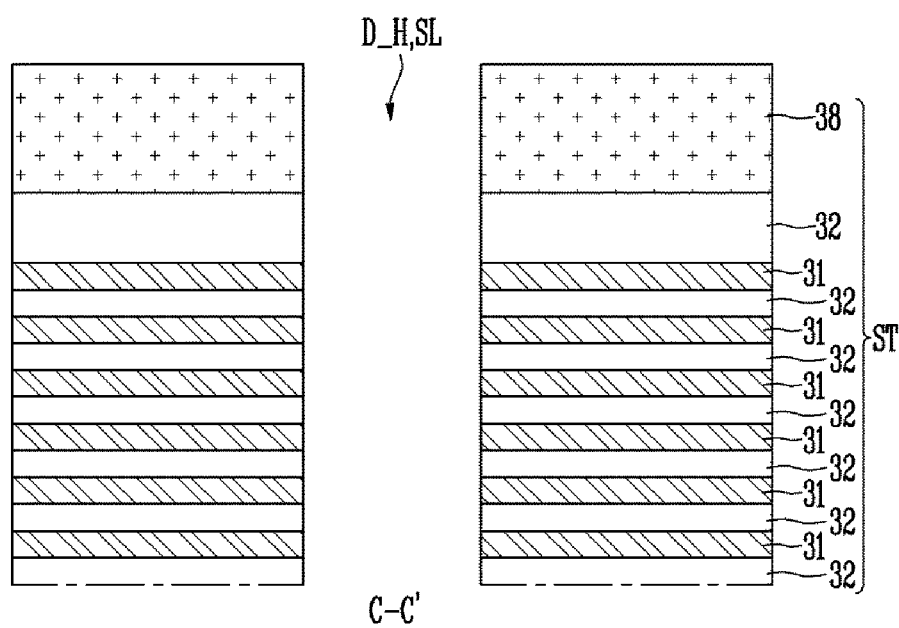

Referring to FIGS. 5A to 5C, the sacrificial layers 33 are removed. For example, the sacrificial layers 33 are selectively etched so that the channel holes C_H and the dummy channel holes D_H open again. As the second sacrificial layers 33B are removed, the dummy channel holes D_H and the slit SL are integrally coupled to each other.

Figure 6A:
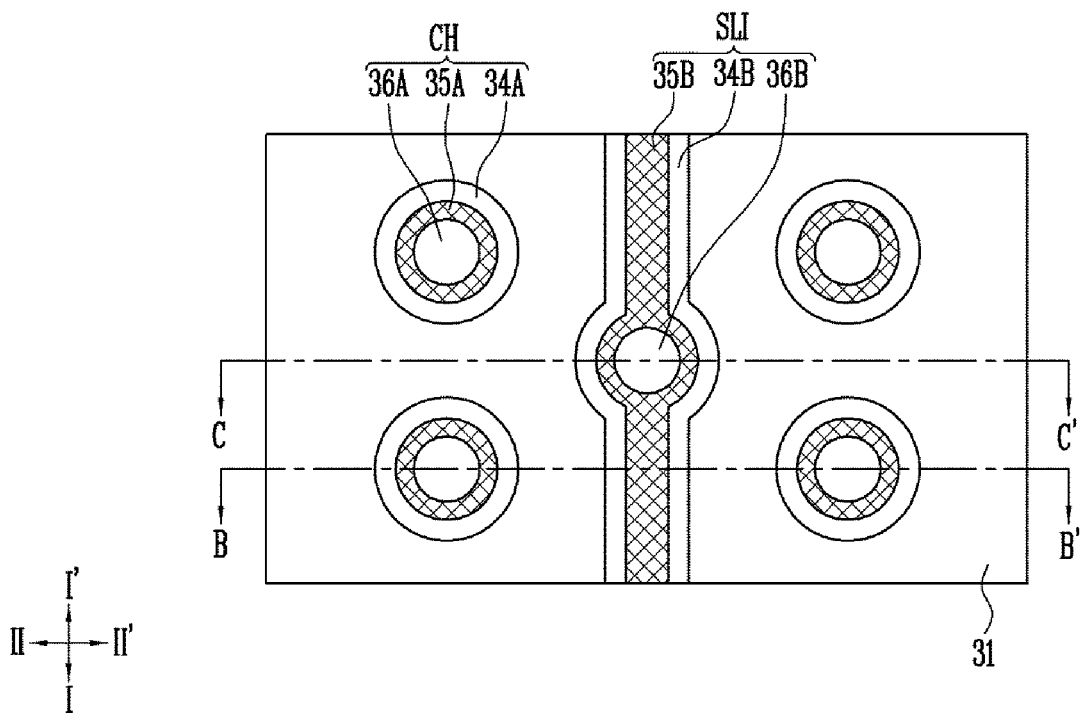
Figure 6B:
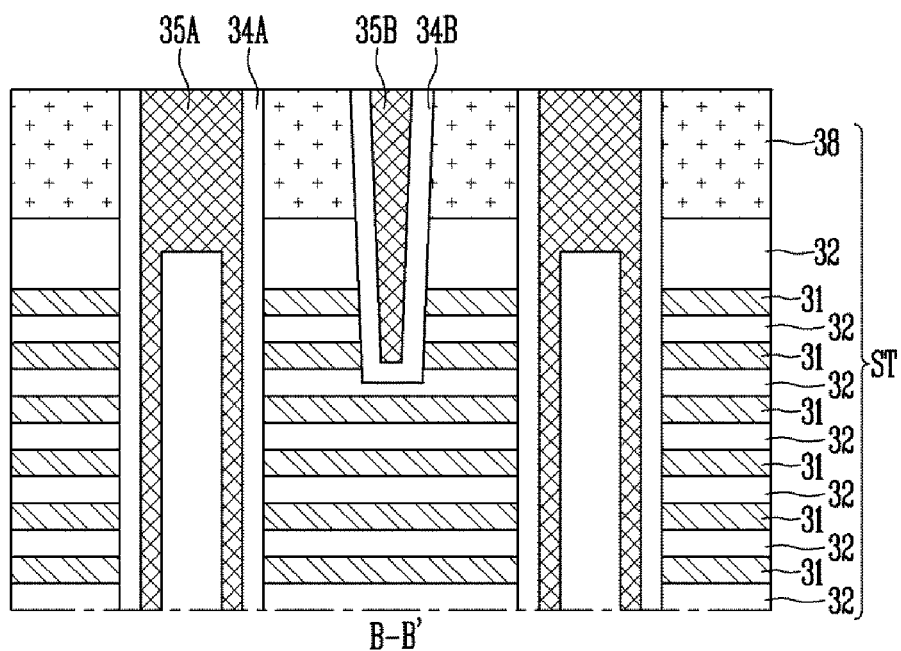
Figure 6C:
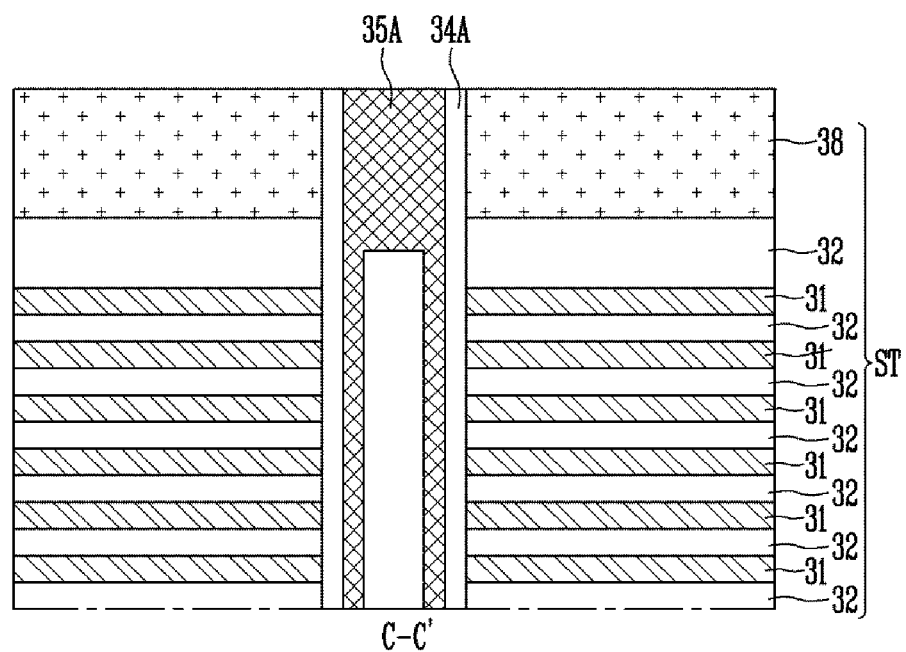

Referring to FIGS. 6A to 6C, channel structures CH are formed in the respective channel holes C_H. For instance, a memory layer 34A, a channel layer 35A, and a gap fill insulating layer 36A are successively formed in each of the channel holes C_H. Furthermore, a slit insulating layer SLI is formed in the dummy channel holes D_H and the slit SL. For example, a dummy memory layer 34B, a dummy channel layer 35B, and a dummy gap fill insulating layer 36B are successively formed in the dummy channel holes D_H and the slit SL.

The channel structures CH and the slit insulating layer SLI may be simultaneously formed. The memory layer 34A and the dummy memory layer 34B may include the same material, and be simultaneously formed. The channel layer 35A and the dummy channel layer 35B may include the same material, and be simultaneously formed. In addition, the gap fill insulating layer 36A and the dummy gap fill insulating layer 36B may include the same material, and be simultaneously formed.

Depending on the width of each dummy channel hole D_H, the width of the slit SL, the thickness of the dummy memory layer 34B and the thickness of the dummy channel layer 35B, the configuration of the slit insulating layer SLI may be changed.

For instance, a dielectric layer is formed in the channel holes C_H, the dummy channel holes D_H and the slit SL. Thereafter, a semiconductor layer is formed in the channel holes C_H, the dummy channel holes D_H and the slit SL. While the slit SL is completely filled with the semiconductor layer, each of the channel holes C_H and the dummy channel holes D_H may have a hollow structure in which a central region thereof is open, rather than being completely filled with the semiconductor layer. Thereafter, a gap fill layer is formed in the channel holes C_H and the dummy channel holes D_H. Subsequently, the gap fill layer, the semiconductor layer and the dielectric layer are planarized until the surface of the stack ST is exposed. As a result, the slit insulating layer SLI having the structure described above with reference to FIG. 2A is formed, and the dummy gap fill insulating layer 36B is formed only in each of the dummy channel holes D_H. In other words, the dummy gap fill insulating layer 36B may not be formed in a region of the slit SL which does not overlap the dummy channel holes D_H.

In an embodiment, a dielectric layer is formed in the channel holes C_H, the dummy channel holes D_H and the slit SL. Thereafter, a semiconductor layer is formed in the channel holes C_H, the dummy channel holes D_H and the slit SL. Thereafter, a gap fill layer is formed in the channel holes C_H, the dummy channel holes D_H and the slit SL. Subsequently, the gap fill layer, the semiconductor layer and the dielectric layer are planarized until the surface of the stack ST is exposed. In this way, the slit insulating layer SLI having the structure described above with reference to FIG. 2B is formed. In other words, the dummy gap fill insulating layer 36B may be formed on the overall region of the dummy channel holes D_H and the slit SL.

In an embodiment, a dielectric layer is formed in the channel holes C_H, the dummy channel holes D_H and the slit SL. Thereafter, a semiconductor layer is formed in the channel holes C_H, the dummy channel holes D_H and the slit SL. While the dummy channel holes D_H and the slit SL are completely filled with the semiconductor layer, each of the channel holes C_H has a hollow structure in which a central region thereof is open, rather than being completely filled with the semiconductor layer. Thereafter, a gap fill layer is formed in the channel holes C_H. Subsequently, the gap fill layer, the semiconductor layer and the dielectric layer are planarized until the surface of the stack ST is exposed. In this way, the slit insulating layer SLI having the structure described above with reference to FIG. 2C is formed. In other words, the dummy channel holes D_H and the slit SL may be completely filled with the dummy channel layer 35B. The dummy gap fill insulating layer 36B may not be formed in the dummy channel holes D_H and the slit SL.

Figure 7A:
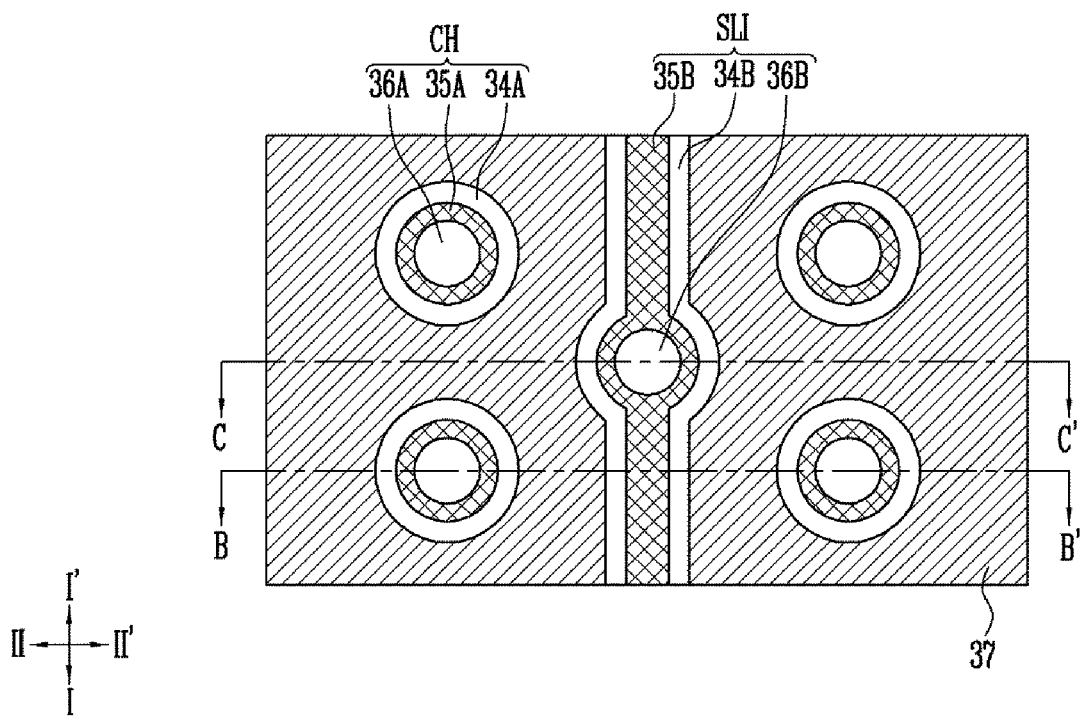
Figure 7B:
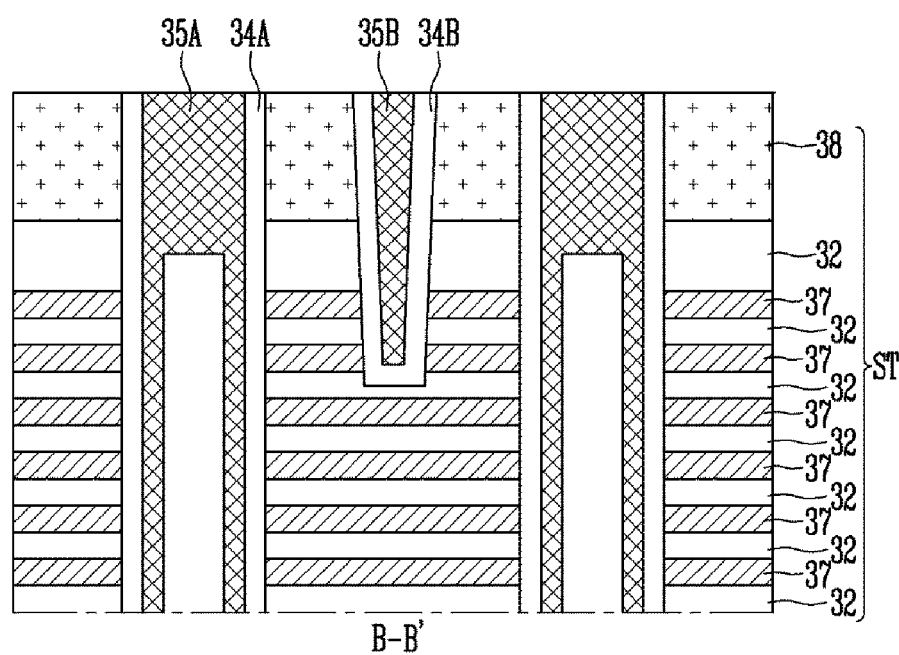
Figure 7C:
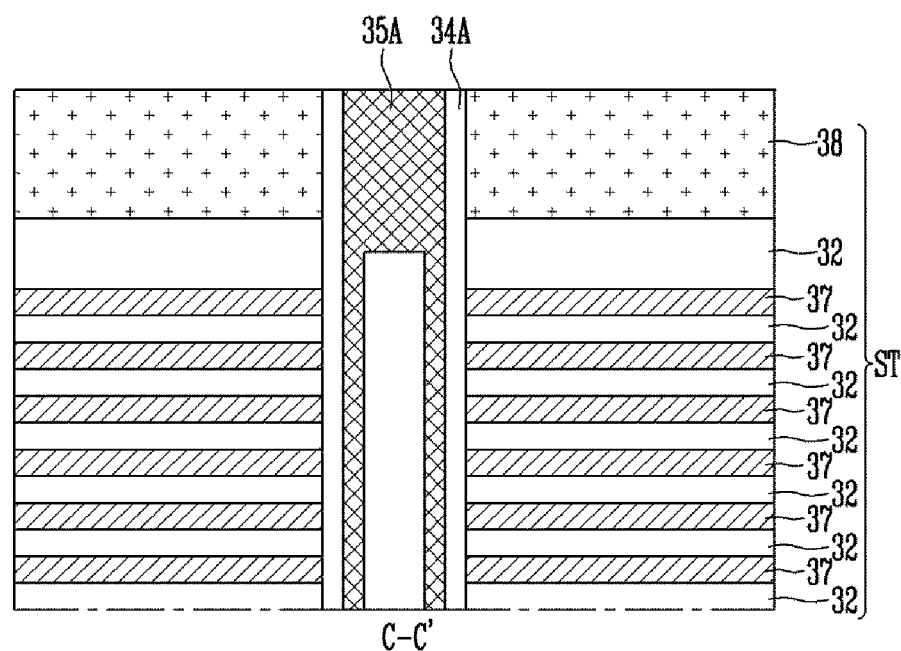

Referring to FIGS. 7A to 7C, depending on material of the first and second material layers 31 and 32, an additional process in which the first material layers 31 or the second material layers 32 are replaced with third material layers 37 may be performed.

For example, in the case where the first material layers 31 are sacrificial layers and the second material layers 32 are insulating layers, conductive layers may substitute for the first material layers 31. In another example, in the case the first material layers 31 are conductive layers and the second material layers 32 are insulating layers, the first material layers 31 may be silicidized. In another example, in the case where the first material layers 31 are conductive layers and the second material layers 32 are sacrificial layers, insulating layers may substitute for the second material layers 32.

According to an above-mentioned manufacturing method, the channel holes C_H and the dummy channel holes D_H are simultaneously formed, and the slit SL is thereafter formed. If the slit SL is formed before the channel holes C_H and the dummy channel holes D_H are formed, etching rates of regions in which the channel holes C_H and the dummy channel holes D_H are formed may differ from each other depending on whether each region overlaps the slit SL, because a target material to be etched in each region that overlaps the slit SL is different from that of each region that does not overlap the slit SL. As a result, the dummy channel holes D_H disposed in the regions overlapping the slit SL and the channel holes C_H disposed in the regions not overlapping the slit SL may not be uniform in etching depth. However, in the present disclosure, the channel holes C_H and the dummy channel holes D_H are formed before the slit SL is formed. Therefore, the channel holes C_H and the dummy channel holes D_H may have the same target material to be etched so that the channel holes C_H and the dummy channel holes D_H can be formed to a uniform depth.

Furthermore, in the manufacturing method according to an embodiment of the present disclosure, the channel holes C_H, the dummy channel holes D_H and the slit SL may be simultaneously filled. In other words, the channel structures in the channel holes C_H and the slit insulating layer in the dummy channel holes D_H and the slit SL may be simultaneously formed. If the channel structures and the slit insulating layer are formed through separate processes, the number of processes may be increased, and the production cost may also be increased. On the contrary, according to an embodiment of the present disclosure, since the slit is filled with layers, e.g., a memory layer, a semiconductor layer and a gap fill insulating layer, for forming the channel structure, the manufacturing process may be simplified, and the manufacturing cost may also be reduced.

Figure 8A:
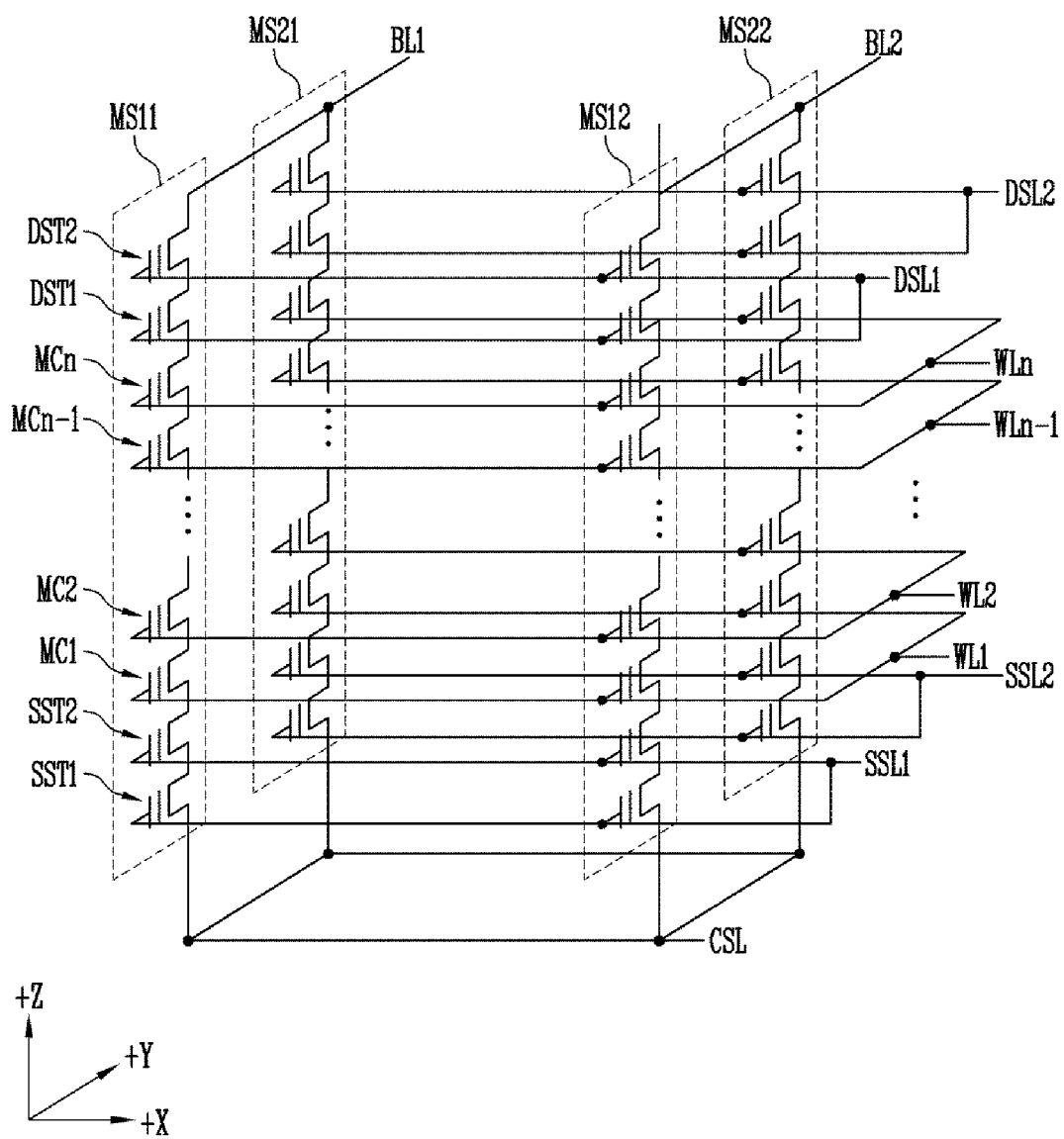
FIGS. 8A and 8B are a circuit diagram and a sectional diagram illustrating the structure of a semiconductor device to which a slit insulating layer is applied, according to an embodiment of the present disclosure.
Figure 8B:
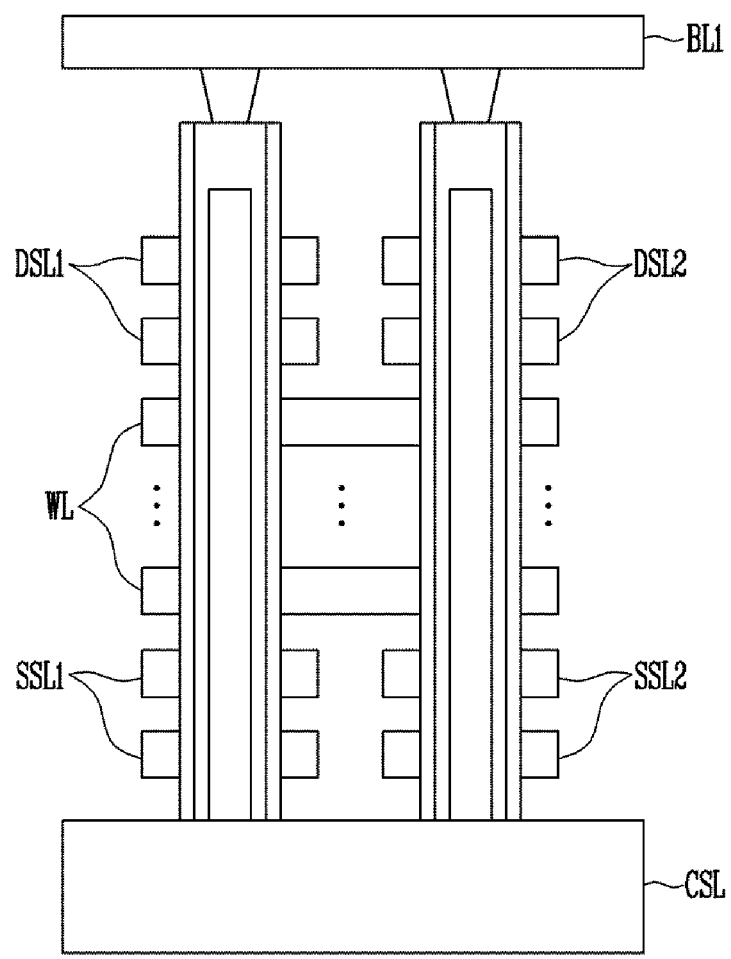

FIGS. 8A and 8B are diagrams illustrating the structure of a semiconductor device to which a slit insulating layer is applied, according to an embodiment of the present disclosure. FIG. 8A is a circuit diagram of a cell array. FIG. 8B is a sectional diagram of the cell array.

Referring to FIGS. 8A and 8B, memory strings MS11 to MS22 are arranged in a row direction (e.g., a positive (+) X direction) and a column direction (e.g., a positive (+) Y direction). Each of the memory strings MS11 to MS22 includes at least one source select transistor SST1, SST2, first to n-th memory cells MC1 to MCn and at least one drain select transistor DST1, DST2. In addition, each of the memory strings MS11 to MS22 may be vertically arranged.

The first to n-th memory cells MC1 to MCn are stacked in a positive (+) Z direction and are coupled in series between the source select transistor SST1, SST2 and the drain select transistor DST1, DST2. Furthermore, gates of the first to n-th memory cells MC1 to MCn of each of the memory strings MS11 to MS22 are coupled to first to n-th word lines WL1 to WLn, respectively.

The memory strings MS11 to MS22 included in each memory block may be coupled in common to a common source line CSL. Furthermore, the couplings between the memory strings MS11 to MS22 and the common source line CSL may be respectively controlled by the source select lines SSL1 and SSL2. In an embodiment, a single memory string MS11 may include a plurality of source select transistors SST1 and SST2. In this case, gates of the source select transistors SST1 and SST2 are coupled in common to a first source select line SSL1, and the coupling between the memory string MS11 and the common source line CSL is controlled by the first source select line SSL1.

The memory strings MS11 to MS22 included in each memory block are coupled to a plurality bit lines BL1 and BL2. The couplings between the memory strings MS11 to MS22 and the bit lines BL1 and BL2 may be respectively controlled by drain select lines DSL1 and DSL2. In an embodiment, a single memory string MS11 may include a plurality of drain select transistors DST1 and DST2. In this case, gates of the drain select transistors SST1 and SST2 are coupled in common to the first drain select line DSL1, and the coupling between the memory string MS11 and the bit line BL is controlled by the first drain select line DSL1.

According to the above-described configuration, the first drain select line DSL1 and the second drain select line DSL2 which are disposed on the same level are electrically separated from each other and are separately driven. Therefore, the slit insulating layer according to an embodiment may be disposed between the first drain select line DSL1 and the second drain select line DSL2 which are adjacent to each other in the Y direction.

Figure 9A:
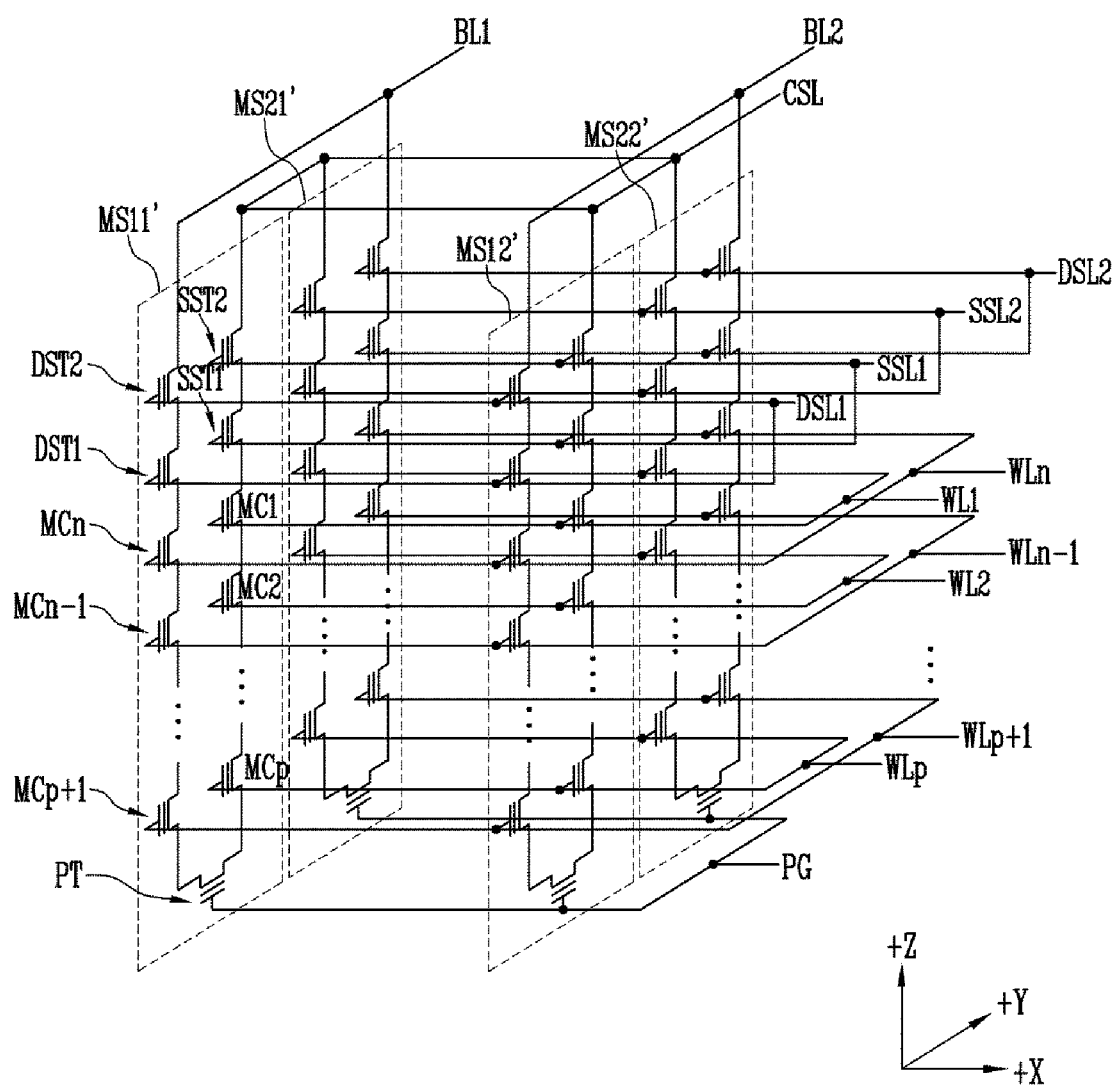
FIGS. 9A and 9B are a circuit diagram and a sectional diagram illustrating the structure of a semiconductor device to which a slit insulating layer is applied, according to an embodiment of the present disclosure.
Figure 9B:
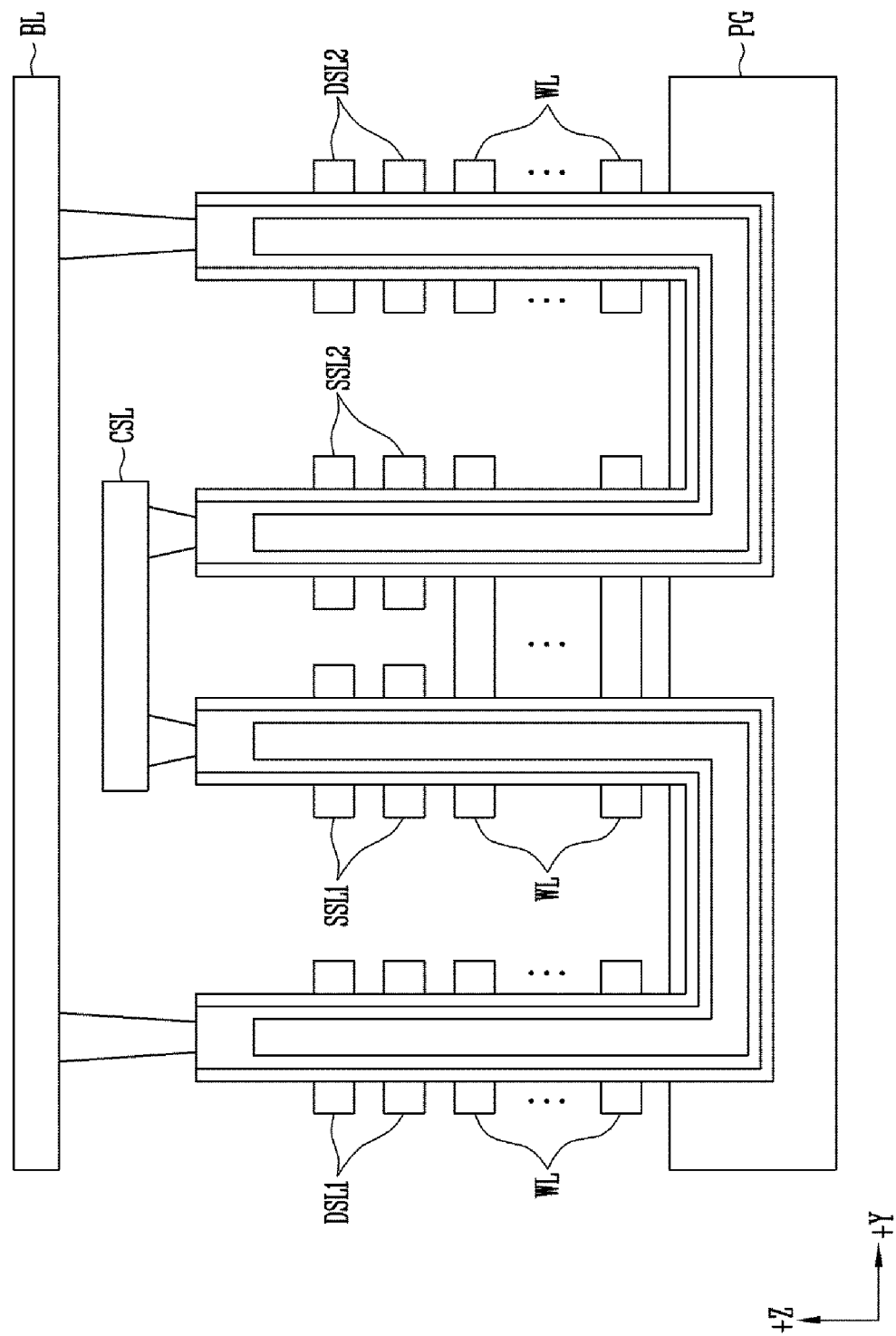

FIGS. 9A and 9B are diagrams illustrating the structure of a semiconductor device to which a slit insulating layer is applied, according to an embodiment of the present disclosure. FIG. 9A is a circuit diagram of a cell array. FIG. 9B is a sectional diagram of the cell array.

Referring to FIGS. 9A and 9B, memory strings MS11' to MS22' are arranged in a row direction (e.g., the +X direction) and a column direction (e.g., the +Y direction). Each of the memory strings MS11' to MS22' includes at least one source select transistor SST1, SST2, first to p-th memory cells MC1 to MCp, a pipe transistor PT, p+1-th to n-th memory cells MCp+1 to MCn, and at least one drain select transistor DST1, DST2. In addition, each of the memory strings MS11' to MS22' may be arranged in a U shape.

The first to p-th memory cells MC1 to MCp are stacked in the +Z direction and coupled in series between the source select transistor SST1, SST2 and the pipe transistor PT. The p+1-th to n-th memory cells MCp+1 to MCn are coupled in series between the pipe transistor PT and the drain select transistor DST1, DST2. Furthermore, gates of the first to n-th memory cells MC1 to MCn of each of the memory strings MS11' to MS22' are coupled to first to n-th word lines WL1 to WLn, respectively.

The memory strings MS11' to MS22' are coupled between the common source line CSL and the bit lines BL1 and BL2. The couplings between the memory strings MS11' to MS22' and the common source line CSL are respectively controlled by the source select lines SSL1 and 55L2. The couplings between the memory strings MS11' to MS22' and the bit lines BL1 and BL2 are respectively controlled by drain select lines DSL1 and DSL2. The detailed coupling relation is similar to that described with reference to FIG. 8A; therefore, further explanation thereof will be omitted.

According to the above-described configuration, the first source select line SSL1 and the second source select line SSL2 which are disposed on the same level are electrically separated from each other and are separately driven. Therefore, the slit insulating layer according to an embodiment may be disposed between the first source select line SSL1 and the second source select line SSL2 which are adjacent to each other in the Y direction. Furthermore, although not illustrated in the drawings, the drain select lines may be disposed to be adjacent to each other in the Y direction, and the slit insulating layer according to an embodiment of the present disclosure may be disposed between the drain select lines that are adjacent to each other in the Y direction.

Figure 10:
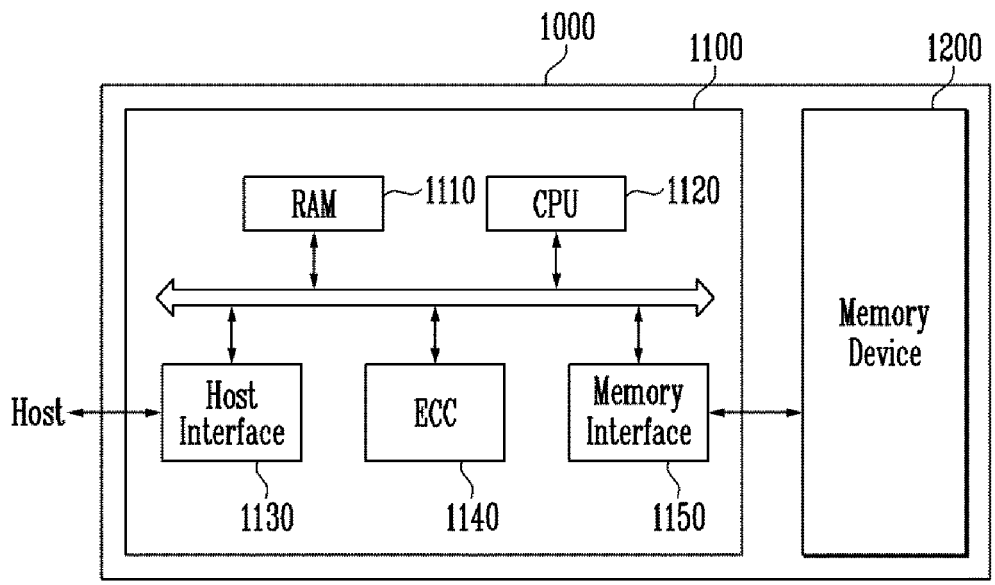
FIGS. 10 and 11 are block diagrams illustrating the configuration of a memory system according to an embodiment of the present disclosure.

FIG. 10 is a block diagram illustrating the configuration of a memory system according to an embodiment of the present disclosure.

Referring FIG. 10, a memory system 1000 according to an embodiment of the present disclosure includes a memory device 1200 and a controller 1100.

The memory device 1200 is used to store data information having a variety of data forms such as text, graphics, software codes. The memory device 1200 may be a non-volatile memory. Furthermore, the memory device 1200 may have the structures described above with reference to FIGS. 1A to 9B, and may be manufactured by the manufacturing methods described above with reference to FIGS. 1A to 9B. In an embodiment, the memory device 1200 may include a stack, channel holes passing through the stack, dummy channel holes passing through the stack and disposed between the channel holes, a slit passing through the stack and the dummy channel holes. The structures of the memory device 1200 and the manufacturing methods thereof are the same as those described above; therefore detailed explanation thereof will be omitted.

The controller 1100 may be coupled to a host Host and the memory device 1200. The controller 1100 is configured to access the memory device 1200 in response to a request from the host Host. For example, the controller 1100 may control read, write, erase, and background operations of the memory device 1200.

The controller 1100 may include a random access memory (RAM) 1110, a central processing unit (CPU) 1120, a host interface 1130, an error correction code (ECC) circuit 1140, and a memory interface 1150.

The RAM 1110 is used as an operating memory of the CPU 1120, a cache memory between the memory device 1200 and the host Host, a buffer memory between the memory device 1200 and the host Host, and so forth. For reference, the RAM 1110 may be replaced with a static random access memory (SRAM), a read only memory (ROM), or the like.

The CPU 1120 may control the overall operation of the controller 1100. For example, the CPU 1120 may operate firmware such as a flash translation layer (FTL) stored in the RAM 1110.

The host interface 1130 may interface with the host Host. For example, the controller 1100 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The ECC circuit 1140 may use an error correction code (ECC) to detect and correct errors in data read from the memory device 1200.

The memory interface 1150 may interface with the memory device 1200. For example, the memory interface 1150 includes a NAND interface or a NOR interface.

For reference, the controller 1100 may further include a buffer memory (not illustrated) for temporarily storing data. The buffer memory may be used to temporarily store data to be transferred from the host interface 1130 to an external device or data to be transferred from the memory interface 1150 to the memory device 1200. The controller 1100 may further include a ROM which stores code data for interfacing with the host Host.

Since the memory system 1000 according to an embodiment may include the memory device 1200 having improved integration and characteristics, the integration and characteristics of the memory system 1000 may also be improved.

Figure 11:
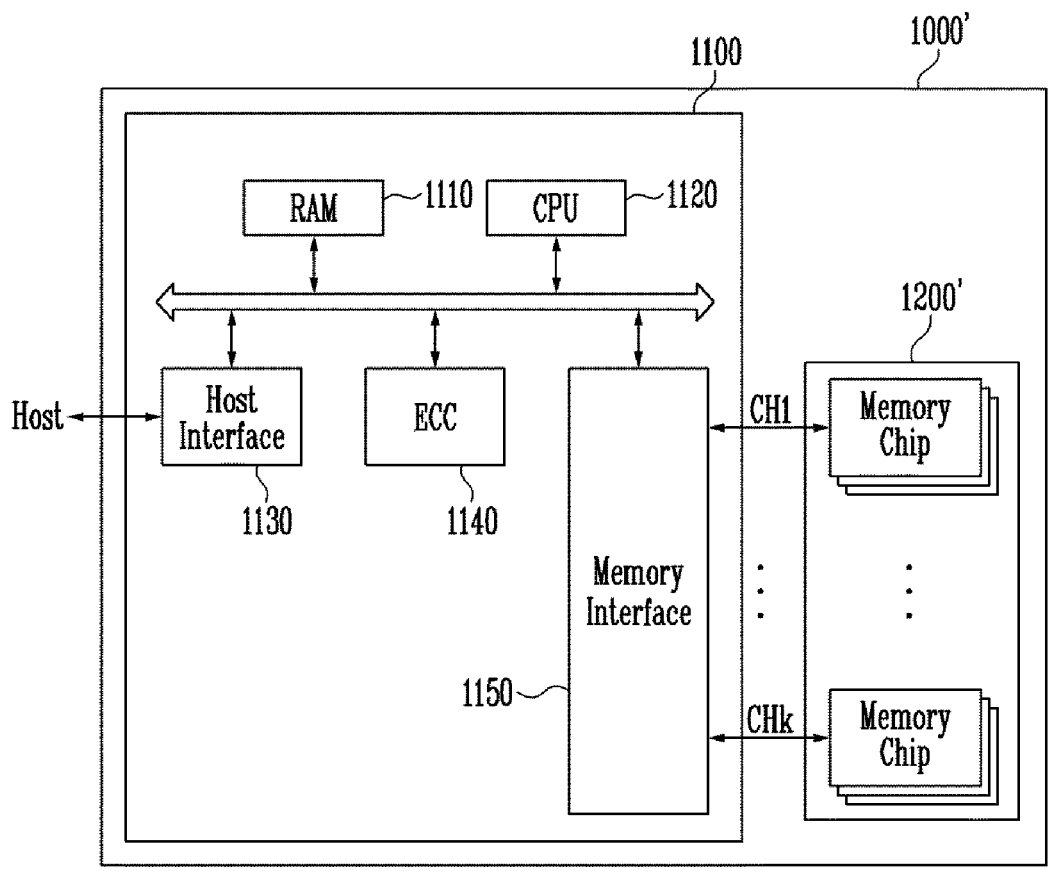

FIG. 11 is a block diagram illustrating the configuration of a memory system according to an embodiment of the present disclosure. Hereinbelow, repetitive explanation will be omitted if deemed redundant.

Referring to FIG. 11, a memory system 1000' according to an embodiment may include a memory device 1200' and a controller 1100. The controller 1100 includes a RAM 1110, a CPU 120, a host interface 1130, an ECC circuit 1140, a memory interface 1150, and so on.

The memory device 1200' may be a nonvolatile memory. Furthermore, the memory device 1200' may have the structures described above with reference to FIGS. 1A to 9B, and may be manufactured by the manufacturing methods described above with reference to FIGS. 1A to 9B. In an embodiment, the memory device 1200' may include a stack, channel holes passing through the stack, dummy channel holes passing through the stack and disposed between the channel holes, a slit passing through the stack and the dummy channel holes. The structures of the memory device 1200' and the manufacturing methods thereof are the same as those described above; therefore detailed explanation thereof will be omitted.

Furthermore, the memory device 1200' may be a multi-chip package including a plurality of memory chips. The plurality of memory chips are divided into a plurality of groups. The plurality of groups are configured to communicate with the controller 1100 through first to k-th channels CH1 to CHk. The memory chips of each group communicate with the controller 1100 through a common channel. For reference, the memory system 1000' may be modified such that each single memory chip is coupled to a corresponding single channel.

As described above, since the memory system 1000' according to an embodiment may include the memory device 1200' having improved integration and characteristics, the integration and characteristics of the memory system 1000' may also be improved. In particular, the memory device 1200' according to a present embodiment is formed of a multi-chip package, whereby the data storage capacity and the operating speed thereof can be enhanced.

Figure 12:
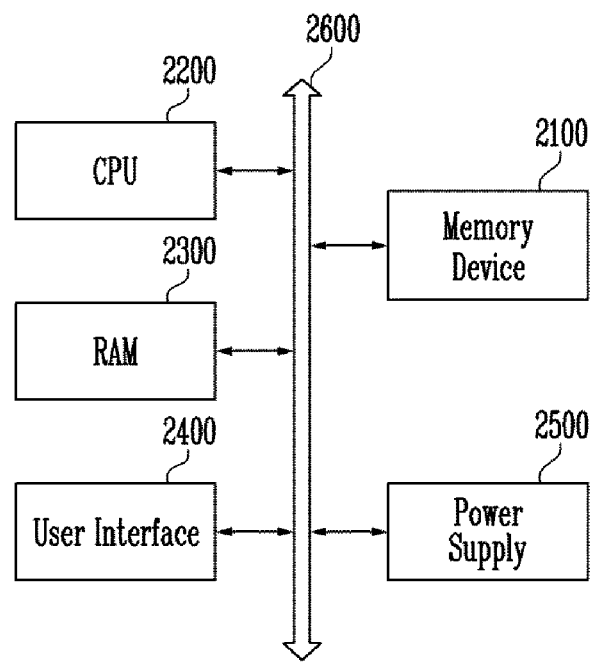
FIGS. 12 and 13 are block diagrams illustrating a computing system according to an embodiment of the present disclosure.

FIG. 12 is a block diagram showing the configuration of a computing system according to an embodiment of the present disclosure. Hereinbelow, repetitive explanation will be omitted if deemed redundant.

Referring to FIG. 12, the computing system 2000 according to an embodiment of the present disclosure includes a memory device 2100, a CPU 2200, a RAM 2300, a user interface 2400, a power supply 2500, a system bus 2600, and so forth.

The memory device 2100 stores data provided via the user interface 2400, data processed by the CPU 2200, etc. Furthermore, the memory deice 2100 is electrically coupled to the CPU 2200, the RAM 2300, the user interface 2400, the power supply 2500, etc. by the system bus 2600. For example, the memory device 2100 may be coupled to the system bus 2600 via a controller (not shown) or, alternatively, directly coupled to the system bus 2600. In the case where the memory device 2100 is directly coupled to the system bus 2600, the function of the controller may be performed by the CPU 2200, the RAM 2300, etc.

The memory device 2100 may be a nonvolatile memory. Furthermore, the memory device 2100 may have the structures described above with reference to FIGS. 1A to 9B, and may be manufactured by the manufacturing methods described above with reference to FIGS. 1A to 9B. In an embodiment, the memory device 2100 may include a stack, channel holes passing through the stack, dummy channel holes passing through the stack and disposed between the channel holes, a slit passing through the stack and the dummy channel holes. The structure of the memory devices 2100 and the manufacturing methods thereof may be the same as those described above; therefore detailed explanation thereof will be omitted.

The memory device 2100 may be a multi-chip package configured with a plurality of memory chips in the same manner as that described above with reference to FIG. 11.

The computing system 2000 having the above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, since the computing system 2000 according to an embodiment may include the memory device 2100 having improved integration and characteristics, the characteristics of the computing system 2000 may also be improved.

Figure 13:
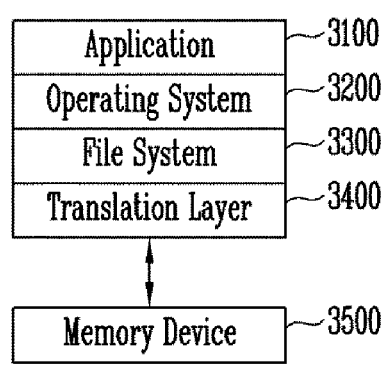

FIG. 13 is a block diagram illustrating a computing system according to an embodiment of the present disclosure.

Referring to FIG. 13, the computing system 3000 according to an embodiment of the present disclosure may include a software layer which has an operating system 3200, an application 3100, a file system 3300, a translation layer 3400, and so forth. Furthermore, the computing system 3000 includes a hardware layer such as a memory device 3500.

The operating system 3200 may manage software resources and hardware resources, etc. of the computing system 3000 and control program execution by the CPU. The application 3100 may be various application programs to be performed in the computing system 3000 and may be a utility implemented by the operating system 3200.

The file system 3300 may refer to a logical structure for controlling data, files, etc. which are present in the computing system 3000, and may organize files or data to be stored in the memory device 3500 or the like according to a given rule. The file system 3300 may be determined depending on the operating system 3200 used in the computing system 3000. For example, if the operating system 3200 is Microsoft's Windows system, the file system 3300 may be a file allocation table (FAT), an NT file system (NTFS), or the like. If the operating system 3200 is a Unix/Linux system, the file system 3300 may be an extended file system (EXT), a Unix file system (UFS), a journaling file system (JFS), or the like.

Although the operating system 3200, the application 3100 and the file system 3300 are expressed by separate blocks in the drawing, the application 3100 and the file system 3300 may be included in the operating system 3200.

The translation layer 3400 may translate an address into a suitable form for the memory device 3500 in response to a request from the file system 3300. For example, the translation layer 3400 translates a logical address produced by the file system 3300 into a physical address of the memory device 3500. Mapping information of the logical address and physical address may be stored in an address translation table. For example, the translation layer 3400 may be a flash translation layer (FTL), a universal flash storage link layer (ULL), or the like.

The memory device 3500 may be a nonvolatile memory. Furthermore, the memory device 3500 may have the structures described above with reference to FIGS. 1A to 9B, and may be manufactured by the manufacturing methods described above with reference to FIGS. 1A to 9B. In an embodiment, the memory device 3500 may include a stack, channel holes passing through the stack, dummy channel holes passing through the stack and disposed between the channel holes, a slit passing through the stack and the dummy channel holes. The structures of the memory device 3500 and the manufacturing methods thereof may be the same as those described above; therefore detailed explanation thereof will be omitted.

The computing system 3000 having the above-mentioned configurations may be divided into an operating system layer which is implemented in an upper level region, and a controller layer which is implemented in a lower level region. The application 3100, the operating system 3200, and the file system 3300 may be included in the operating system layer, and may be driven by an operating memory of the computing system 3000. The translation layer 3400 may be included in the operating system layer or the controller layer.

As described above, since the computing system 3000 according to an embodiment may include the memory device 3500 having improved integration and characteristics, the characteristics of the computing system 3000 may also be improved.

The present disclosure may provide a semiconductor device having a stable structure and improved reliability. In manufacturing the semiconductor device, the manufacturing process may be facilitated, and a procedure thereof may be simplified, and the manufacturing cost may be reduced.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
   a stack;
   channel holes passing through the stack;
   dummy channel holes passing through the stack and disposed between the channel holes;
   a slit passing through the stack and overlapping with the dummy channel holes to couple the dummy channel holes to each other;
   channel layers formed in the channel holes;
   dummy channel layers including first semiconductor patterns formed in the dummy channel holes, and second semiconductor patterns formed in the slit and coupling the first semiconductor patterns with each other;
   first dummy gap fill insulating patterns formed in the respective first semiconductor patterns of the dummy channel layers and second dummy gap fill insulating patterns formed in the slit and coupling the first dummy gap fill insulating patterns with each other; and
   dummy memory layers formed in the dummy channel holes and the slit and enclosing the respective dummy channel layers,
   wherein the stack comprises stacked word lines, and select lines disposed over the word lines,
   wherein each of the second semiconductor patterns has a first depth at which the second semiconductor pattern passes through the select lines,
   wherein each of the first semiconductor patterns has a second depth at which the first semiconductor pattern passes through the stack,
   wherein the first depth is less than the second depth, and
   wherein the dummy memory layers include multilayer dielectric layers.

2. The semiconductor device according to claim 1, wherein the channel holes include memory layers enclosing the respective channel layers.

3. The semiconductor device according to claim 1, wherein the slit has a depth at which the select lines are separated from each other by the slit.

4. The semiconductor device according to claim 1,
   wherein the dummy channel hole has a first width and the slit has a second width, and
   wherein the second width is less than the first width.

5. The semiconductor device according to claim 1, further comprising:
   gap fill insulating layers formed in the respective channel layers.

6. The semiconductor device according to claim 1, further comprising:
gap fill insulating layers formed in the respective channel layers,
wherein the second dummy gap fill insulating patterns formed in the respective second semiconductor patterns of the dummy channel layers couple the first dummy gap fill insulating patterns with each other.

7. The semiconductor device according to claim 1, wherein the first and second semiconductor patterns comprise semiconductor material.

8. The semiconductor device according to claim 1, wherein the dummy channel holes have a different depth from the slit.

9. The semiconductor device according to claim 1, wherein the dummy channel holes have a greater depth than the slit.

10. A semiconductor device comprising:
a stack;
a channel layer passing through the stack to a first depth;
a dummy channel layer comprising first semiconductor patterns passing through the stack to the first depth, and second semiconductor patterns passing through the stack to a second depth less than the first depth and coupling the first semiconductor patterns with each other; and
first dummy gap fill insulating patterns formed in the respective first semiconductor patterns of the dummy channel layer and second dummy gap fill insulating patterns formed in the respective second semiconductor patterns of the dummy channel layers,
wherein the stack comprises stacked word lines, and select lines disposed over the word lines, and each of the second semiconductor patterns has a depth at which the second semiconductor pattern passes through the select lines.

11. The semiconductor device according to claim 10, further comprising:
a memory layer enclosing the channel layer;
a dummy memory layer enclosing the dummy channel layer; and
a gap fill insulating layer formed in the channel layer.

12. The semiconductor device according to claim 10, further comprising:
a memory layer enclosing the channel layer;
a dummy memory layer enclosing the dummy channel layer;
a gap fill insulating layer formed in the channel layer,
wherein the second dummy gap fill insulating patterns formed in the respective second semiconductor patterns of the dummy channel layer couple the first dummy gap fill insulating patterns with each other.

13. The semiconductor device according to claim 10, further comprising:
a memory layer enclosing the channel layer; and
a dummy memory layer enclosing the dummy channel layer.

14. The semiconductor device according to claim 10, wherein each of the first semiconductor patterns has a first width and each of the second semiconductor patterns has a second width, and
wherein the second width is less than the first width.

15. A semiconductor device comprising:
a stack;
channel layers passing through the stack;
a slit insulating layer disposed between the channel layers, the slit insulating layer comprising a semiconductor pattern passing through the stack and extending in a first direction, and an insulating pattern enclosing the semiconductor pattern; and
a dummy gap fill insulating pattern formed in the semiconductor pattern,
wherein the slit insulating layer comprises first regions passing through the stack to a first depth, and second regions passing through the stack to a second depth less than the first depth and coupling the first regions,
wherein the dummy gap fill insulating pattern formed in the semiconductor pattern passes through the stack to the first depth in the first regions and passes through the stack to the second depth in the second regions,
wherein the stack comprises stacked word lines, and select lines disposed over the word lines, and each of the second regions has the second depth at which the second region passes through the select lines,
wherein the semiconductor pattern comprises a first portion and a second portion,
wherein the first portion of the semiconductor pattern has a third depth at which the first portion of the semiconductor pattern passes through the stack,
wherein the second portion of the semiconductor pattern has a fourth depth at which the second portion of the semiconductor pattern passes through the select lines,
wherein the fourth depth is less than the third depth, and
wherein the slit insulating layer further comprises a dummy memory layer including multilayer dielectric layers.

16. The semiconductor device according to claim 15, wherein the slit insulating layer passes through a portion of the stack.

17. The semiconductor device according to claim 15, wherein the semiconductor pattern in the slit insulating layer is in a floating state.

18. The semiconductor device according to claim 15, wherein the first regions have a same depth as the channel layers.

19. The semiconductor device according to claim 15, further comprising:
gap fill insulating layers formed in the channel layers.

* * * * *